United States Patent
Kutsukake et al.

(10) Patent No.: US 8,625,349 B2
(45) Date of Patent: Jan. 7, 2014

(54) POTENTIAL RELATIONSHIP IN AN ERASING OPERATION OF A NONVOLATILE SEMICONDUCTOR MEMORY

(75) Inventors: Hiroyuki Kutsukake, Yokohama (JP); Kenji Gomikawa, Yokohama (JP); Mitsuhiro Noguchi, Yokohama (JP); Kikuko Sugimae, Yokohama (JP); Masato Endo, Yokohama (JP); Takuya Futatsuyama, Yokohama (JP); Koji Kato, Yokohama (JP); Kanae Uchida, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 318 days.

(21) Appl. No.: 12/618,200

(22) Filed: Nov. 13, 2009

(65) Prior Publication Data

US 2010/0124117 A1    May 20, 2010

(30) Foreign Application Priority Data

Nov. 19, 2008    (JP) .................................. 2008-295846

(51) Int. Cl.
*G11C 11/34* (2006.01)
(52) U.S. Cl.
USPC ............ 365/185.11; 365/185.05; 365/185.29; 365/185.01; 365/185.13; 365/185.17; 365/185.18; 365/185.21; 365/185.23; 365/185.27; 365/185.33
(58) Field of Classification Search
USPC ............ 365/185.11, 185.05, 185.29, 185.01, 365/185.13, 185.17, 185.18, 185.21, 365/185.23, 185.27, 185.33
See application file for complete search history.

(56) References Cited

U.S. PATENT DOCUMENTS

| | | | |
|---|---|---|---|
| 5,546,341 | A | 8/1996 | Suh et al. |
| 7,532,059 | B2 | 5/2009 | Naritake |
| 2005/0013168 | A1* | 1/2005 | Futatsuyama et al. ... 365/185.17 |
| 2008/0253181 | A1* | 10/2008 | Edahiro et al. ........... 365/185.03 |
| 2008/0298125 | A1* | 12/2008 | Taniwaki et al. ........ 365/185.05 |
| 2009/0161427 | A1 | 6/2009 | Nakamura et al. |

FOREIGN PATENT DOCUMENTS

| | | |
|---|---|---|
| JP | 2-196469 | 8/1990 |
| JP | 8-287696 | 11/1996 |
| JP | 2006-252744 | 9/2006 |
| JP | 2007-281267 | 10/2007 |
| KR | 10-0559715 | 3/2006 |
| KR | 10-0579026 | 5/2006 |

OTHER PUBLICATIONS

Office Action issued Feb. 10, 2011, in Korean Patent Application No. 10-2009-111989 with English translation.

(Continued)

*Primary Examiner* — Fernando Hidalgo
(74) *Attorney, Agent, or Firm* — Oblon, Spivak, McClelland, Maier & Neustadt, L.L.P.

(57) ABSTRACT

A memory includes a first word line which is connected to a control gate electrode of a first memory cell, a second word line which is connected to a control gate electrode of a second memory cell, a potential transfer line which is connected to both of the first and second word lines, a first N-channel MOS transistor which is connected between the first word line and the potential transfer line, and a second N-channel MOS transistor which is connected between the second word line and the potential transfer line. A control circuit supplies a first potential with a plus value to a semiconductor substrate, and supplies a second potential with the plus value lower than the first potential to the potential transfer line, to turn the first N-channel MOS transistor on, and to turn the second N-channel MOS transistor off, in erasing data of the first memory cell.

9 Claims, 17 Drawing Sheets

(56) References Cited

OTHER PUBLICATIONS

Toru Tanzawa, et al., "Circuit Techniques for a 1.8-V-Only NAND Flash Memory", IEEE Journal of Solid State Circuits, vol. 37, No. 1, Jan. 2002, pp. 84-89.

U.S. Appl. No. 12/728,432, filed Mar. 22, 2010, Gomikawa.
Office Action mailed Nov. 27, 2012 issued in Japanese Patent Application No. 2008-295846 (with English translation).

* cited by examiner

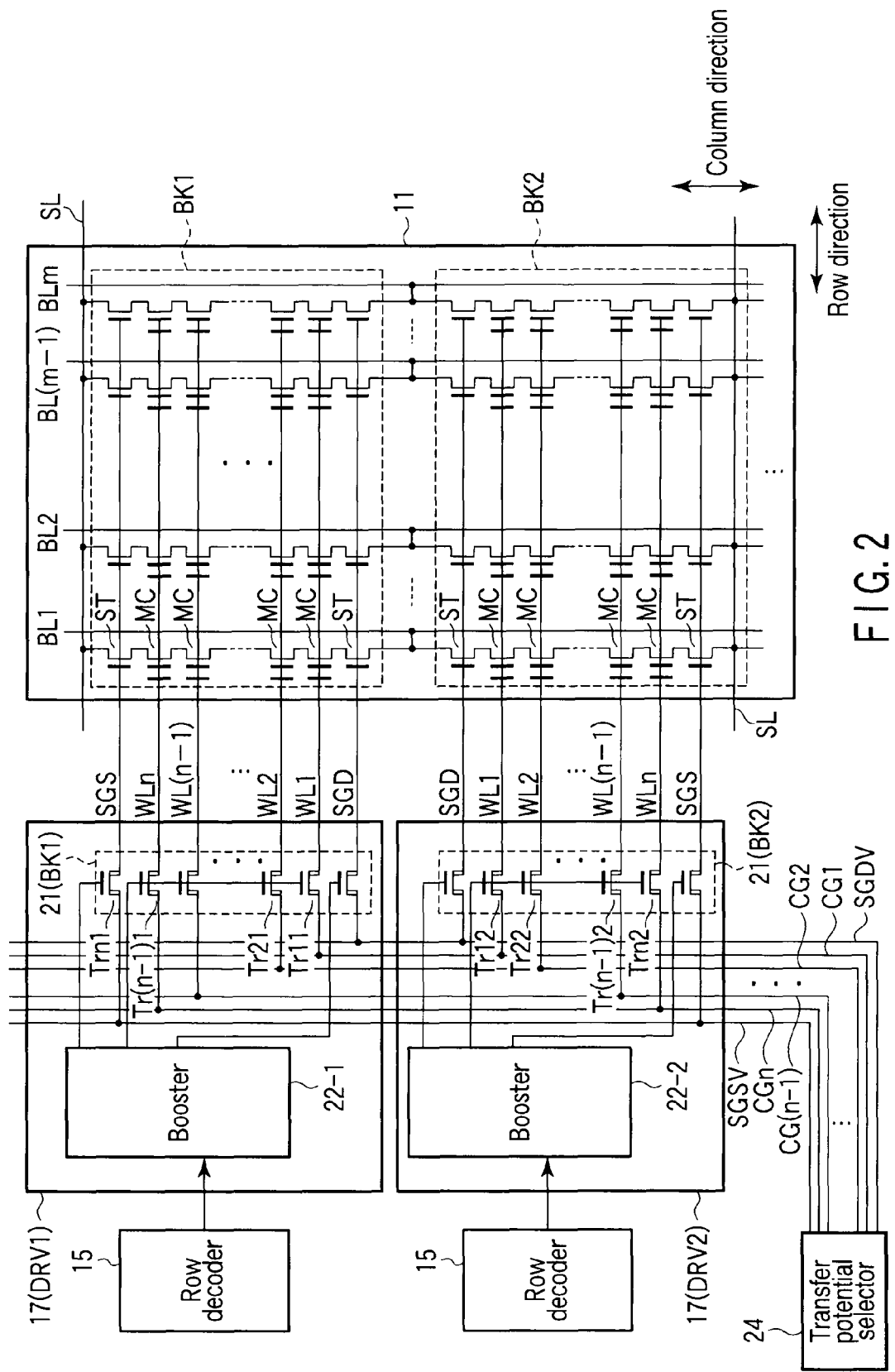
F I G. 2

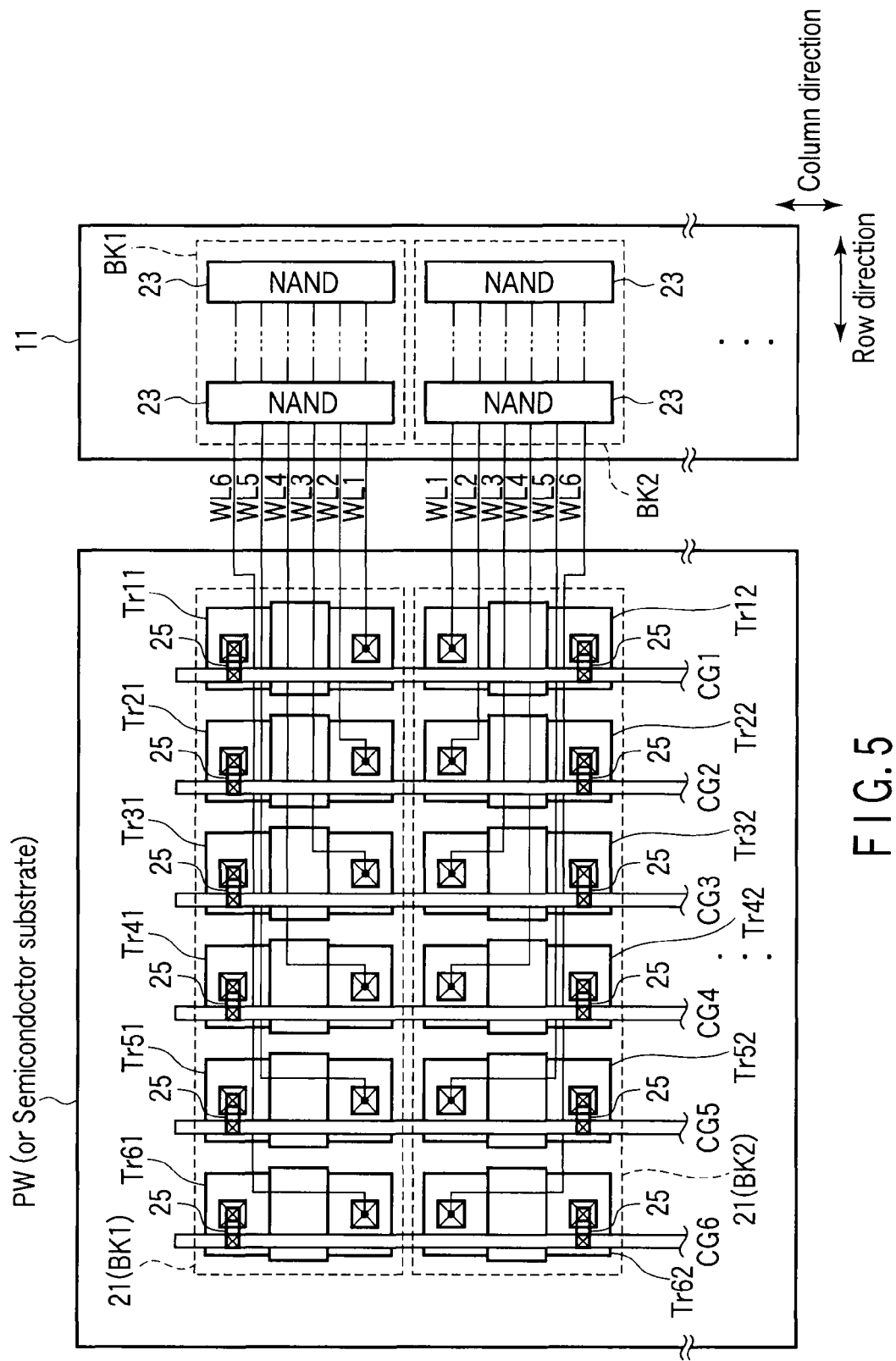
F I G. 5

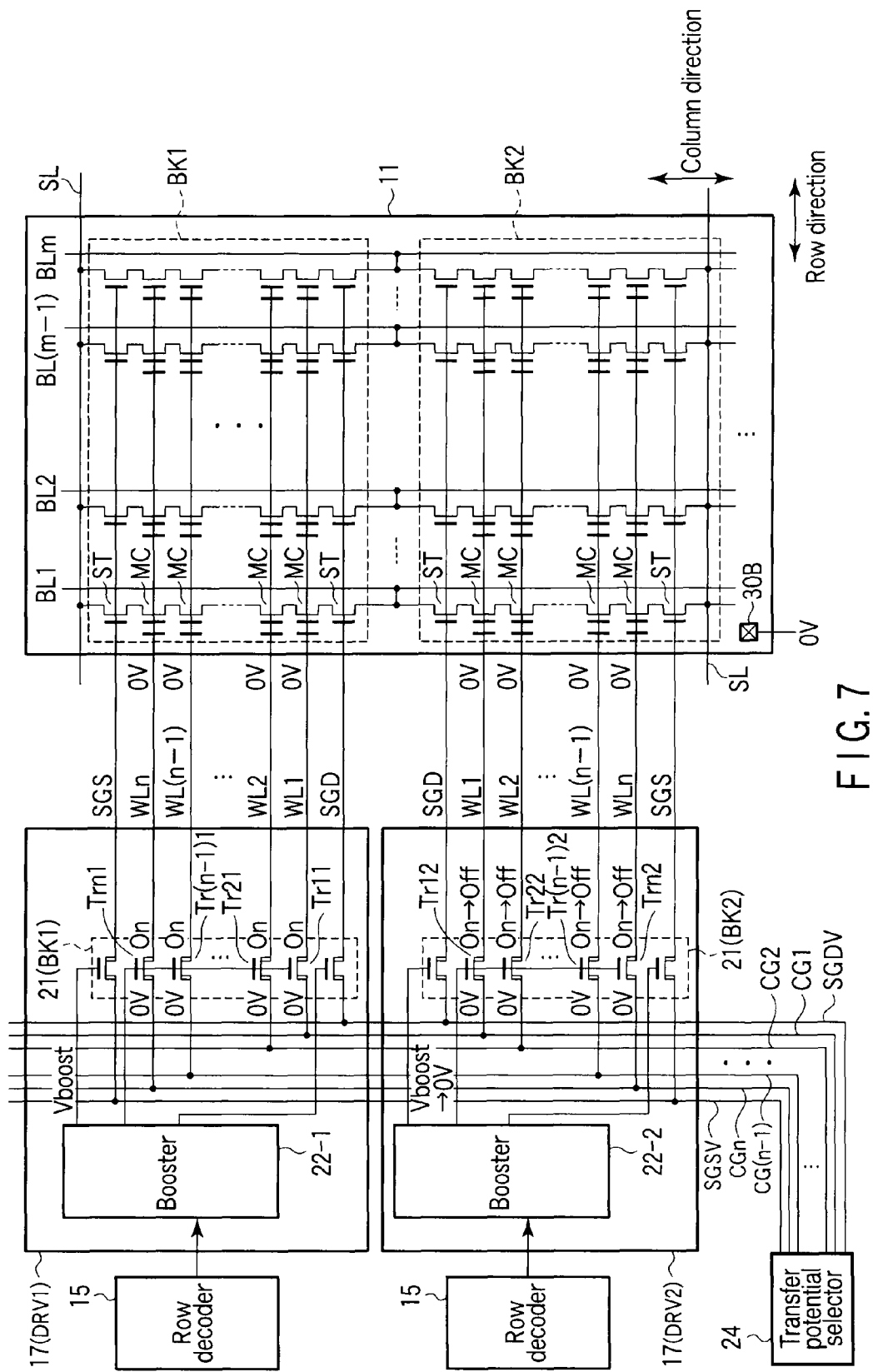
F I G. 7

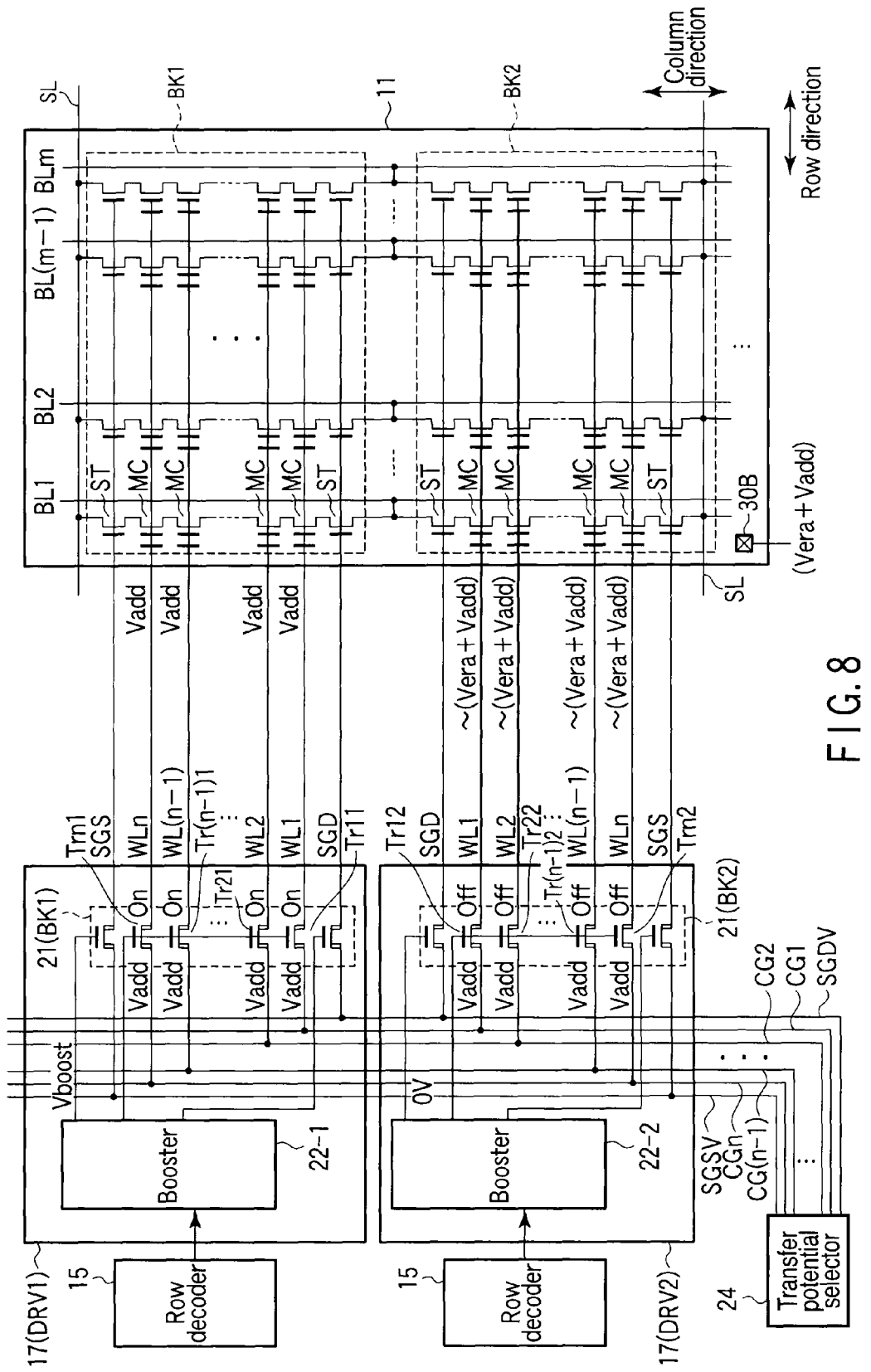
F I G. 8

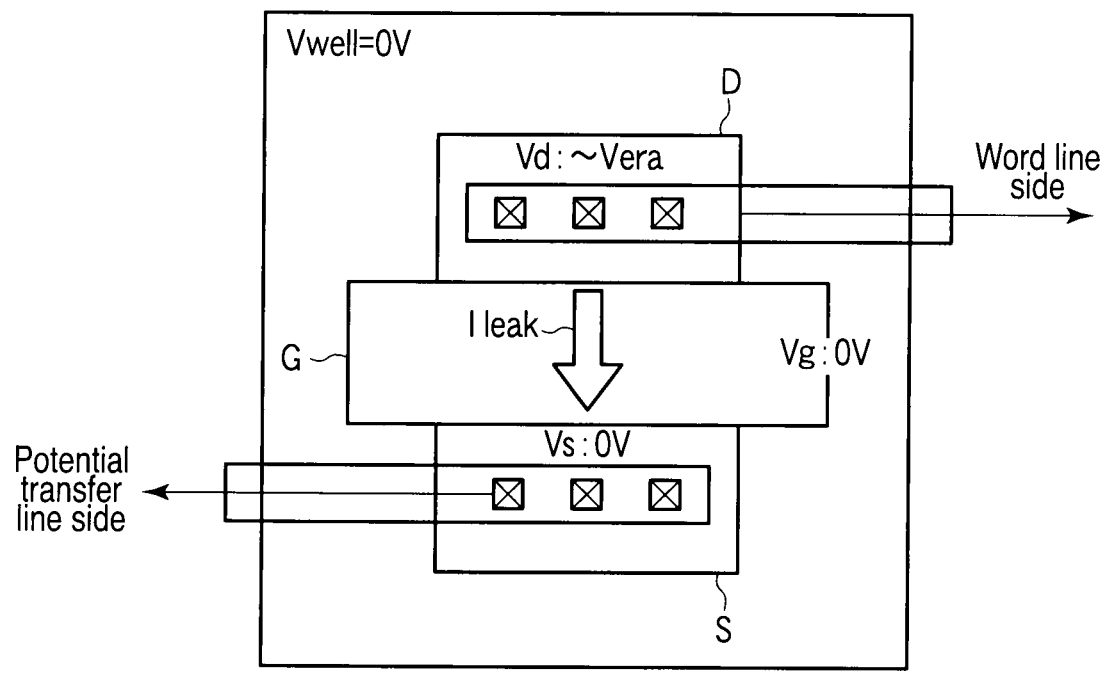
F I G. 11

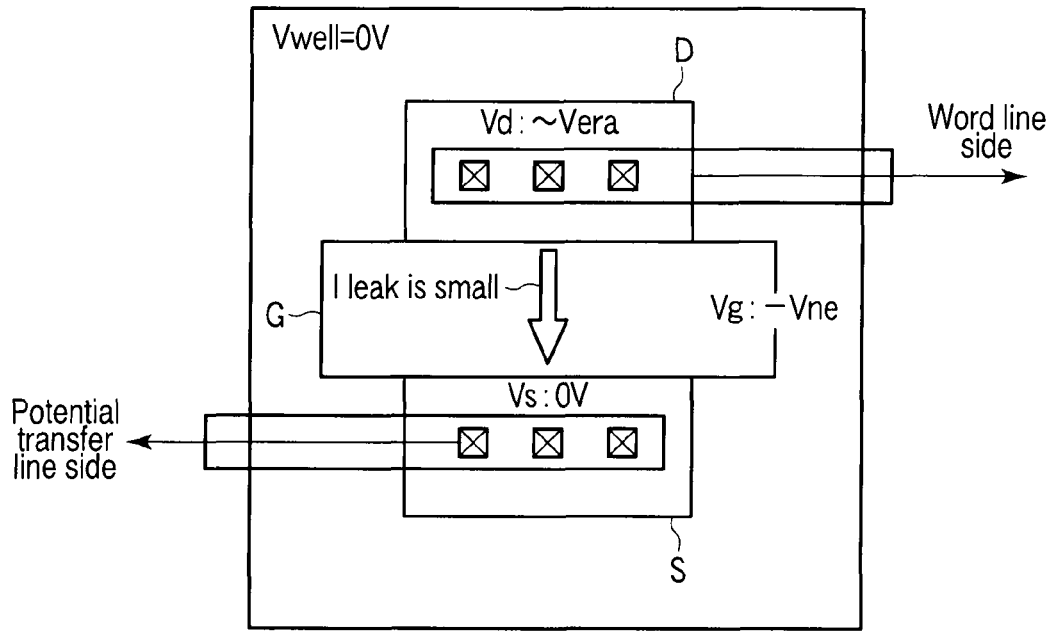
F I G. 14
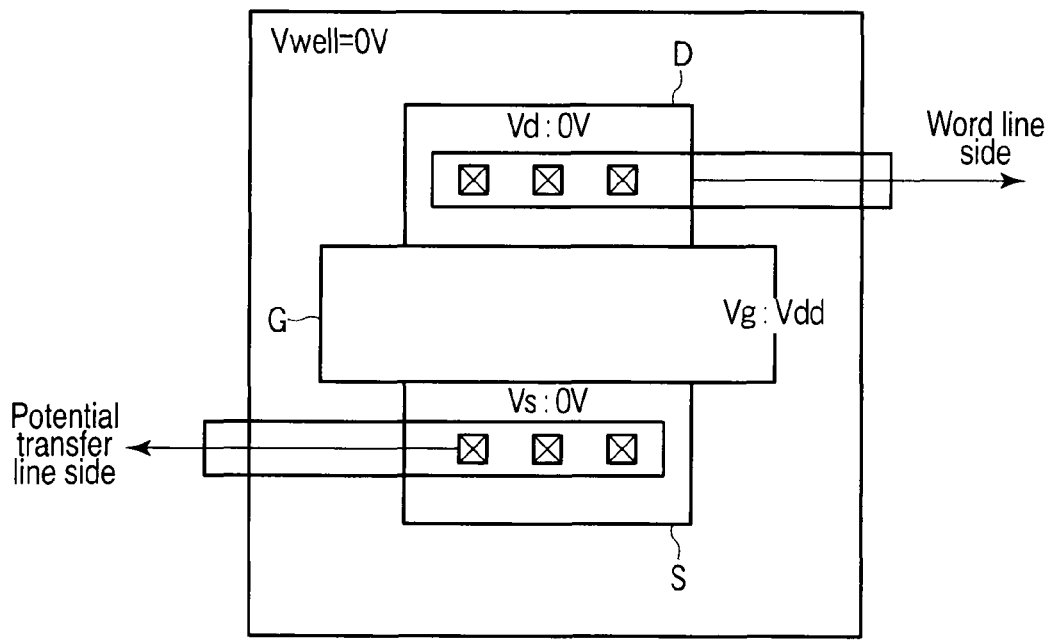
F I G. 15

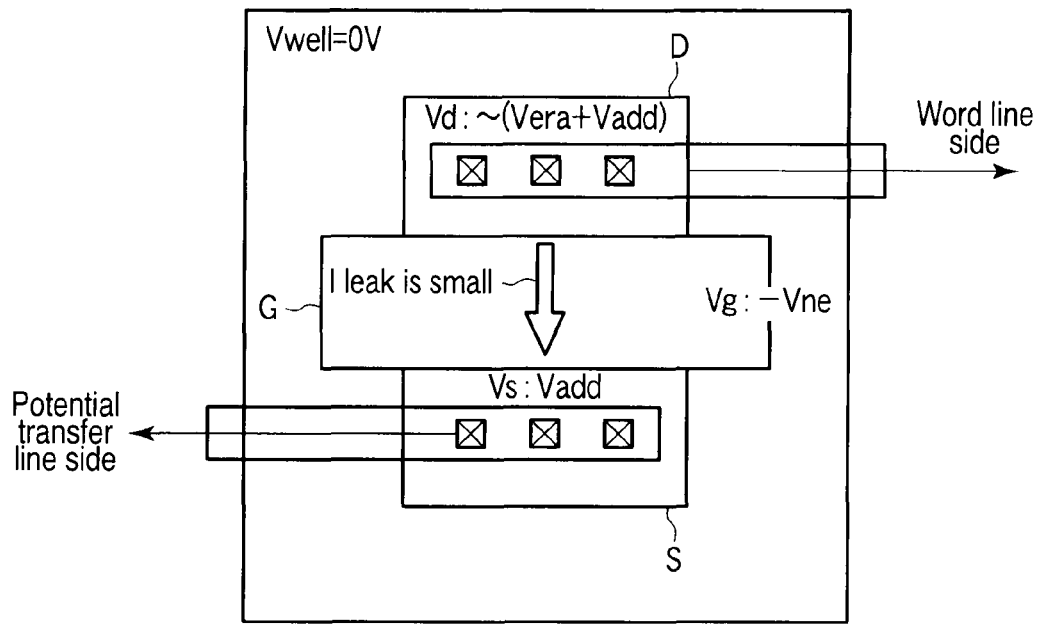
F I G. 17
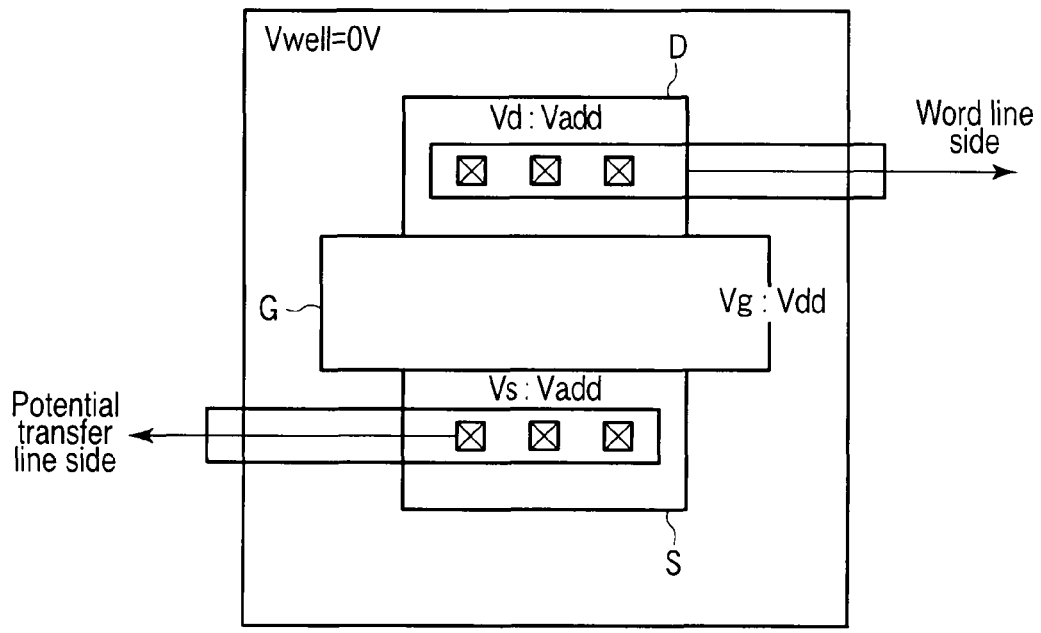
F I G. 18

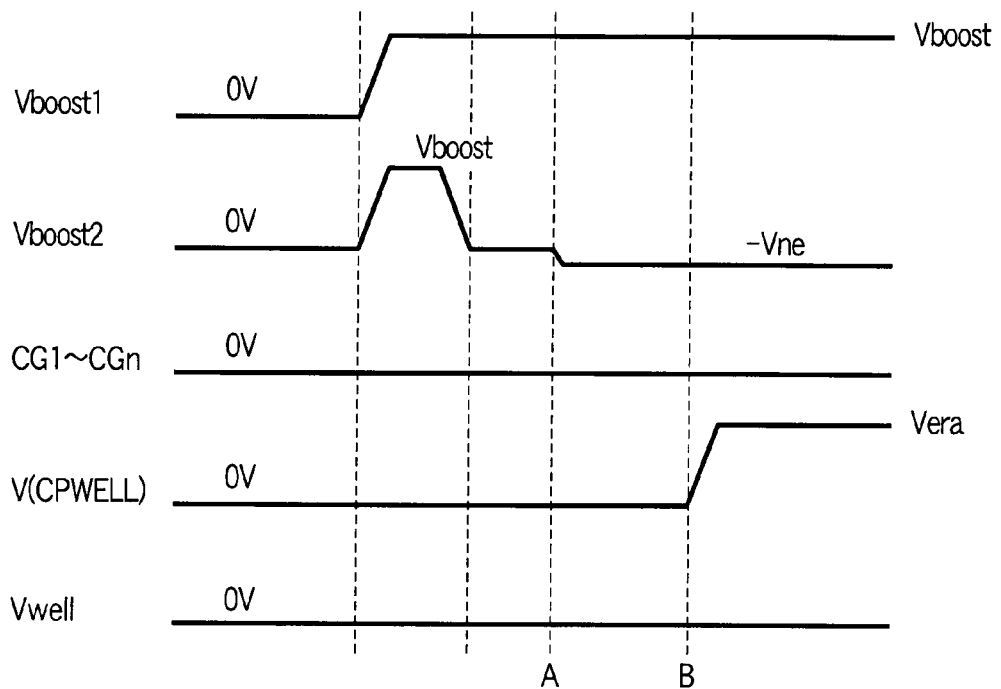
F I G. 21
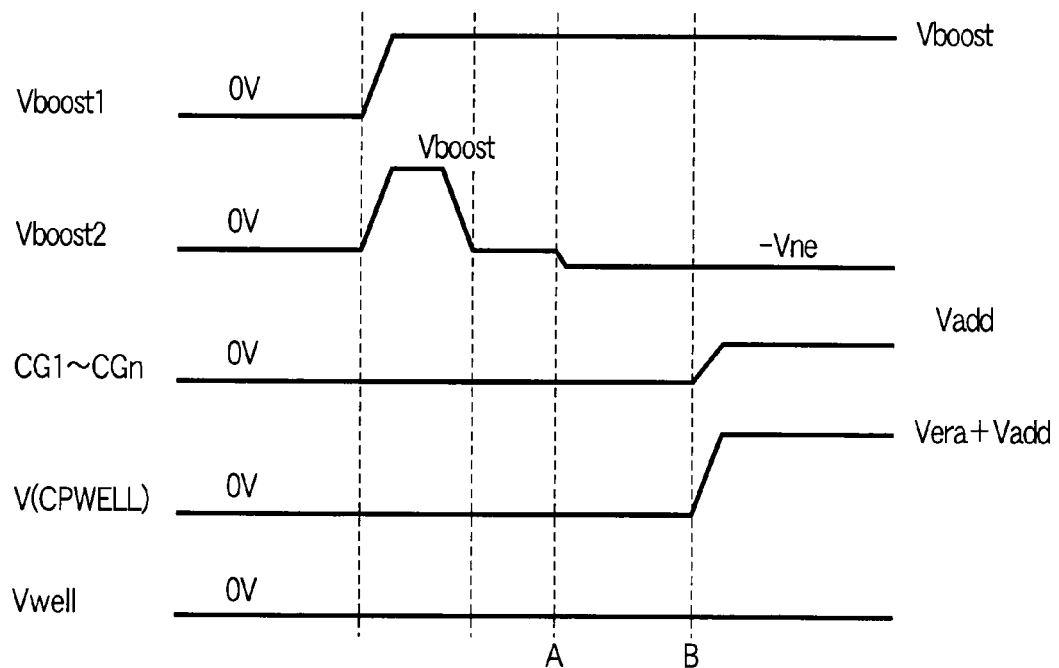
F I G. 22

US 8,625,349 B2

POTENTIAL RELATIONSHIP IN AN ERASING OPERATION OF A NONVOLATILE SEMICONDUCTOR MEMORY

CROSS-REFERENCE TO RELATED APPLICATIONS

This application is based upon and claims the benefit of priority from prior Japanese Patent Application No. 2008-295846, filed Nov. 19, 2008, the entire contents of which are incorporated herein by reference.

BACKGROUND OF THE INVENTION

1. Field of the Invention

The present invention relates to a potential relationship in an erasing operation of a nonvolatile semiconductor memory.

2. Description of the Related Art

A nonvolatile semiconductor memory, such as a NAND type flash memory, in which data of two levels or more is stored by a charge amount in a charge storage layer, has three basic operations of programming, reading, and erasing. The programming means an operation for injecting electrons into the charge storage layer, and the erasing means an operation for emitting electrons from the charge storage layer or injecting holes into the charge storage layer.

In the nonvolatile semiconductor memory, a memory cell array includes memory blocks (for example, NAND blocks), and units of memory block is erased at one time (for example, see Jpn. Pat. Appln. KOKAI Publication Nos. 2-196469 and 2007-281267).

During data erasing, in the selected memory block, channel portions of all the memory cells are set to an erasing potential (high positive potential) and all word lines (control gate electrodes of memory cells) are set to a ground potential.

Accordingly, in all the memory cells of the selected memory block, electrons are emitted from the charge storage layer to the channel portion, or holes are injected from the channel portion into the charge storage layer, thereby performing the data erasing.

In the non-selected memory block, potentials at all the word lines are boosted to a boost potential (a positive high potential lower than the erasing potential) by capacitive coupling, because all the word lines are set to floating while the channel portions of all the memory cells are set to the erasing potential.

Accordingly, the data stored in any memory cells of the non-selected memory block is not erased.

Transfer transistor blocks are provided according to the memory blocks. Each transfer transistor block includes high-potential transfer N-channel MOS transistors having the same number as the word lines in one block. In the high-potential transfer N-channel MOS transistors, one end of a diffusion layer is connected to word lines in one block, and the other end of the diffusion layer is connected to potential transfer lines (control gate lines). And one of the high-potential transfer N-channel MOS transistors in each of the transfer transistor blocks have the potential transfer lines in common.

During the erasing, the ground potential is applied to the potential transfer line, the high-potential transfer N-channel MOS transistor in the transfer transistor block corresponding to the selected memory block is turned on, and the high-potential transfer N-channel MOS transistor in the transfer transistor block corresponding to the non-selected memory block is turned off.

Therefore, in the high-potential transfer N-channel MOS transistor in the transfer transistor block corresponding to the non-selected memory block, the ground potential is applied to a source (potential transfer line side), and the boost potential is applied to a drain (word line side).

At this state, a minutely small amount of punch-through leakage is produced between the source diffusion layer and the drain diffusion layer in the high-potential transfer N-channel MOS transistor in the transfer transistor block corresponding to the non-selected memory block, which causes electrons to be trapped in a gate insulating film of the high-potential transfer N-channel MOS transistor or in an interface between the semiconductor substrate and the source/drain diffusion layer.

Accordingly, when the number of erasing times is increased to apply a voltage stress for a long time between the source diffusion layer and the drain diffusion layer of the high-potential transfer N-channel MOS transistor in a cut-off state, the number of trapped electrons is increased to degrade reliability, such as reduction of high-potential transfer characteristics and programming/erasing error.

BRIEF SUMMARY OF THE INVENTION

A nonvolatile semiconductor memory according to an aspect of the present invention comprises a semiconductor substrate, first and second memory cells each having a charge storage layer and a control gate electrode, which are disposed above the semiconductor substrate, a first word line which is connected to the control gate electrode of the first memory cell, a second word line which is connected to the control gate electrode of the second memory cell, a potential transfer line which is connected to both of the first and second word lines, a first N-channel MOS transistor which is connected between the first word line and the potential transfer line, a second N-channel MOS transistor which is connected between the second word line and the potential transfer line, and a control circuit which supplies a first potential with a plus value to the semiconductor substrate, and which supplies a second potential with the plus value lower than the first potential to the potential transfer line, to turn the first N-channel MOS transistor on, and to turn the second N-channel MOS transistor off, in a data erasing to the first memory cell.

A nonvolatile semiconductor memory according to an aspect of the present invention comprises a semiconductor substrate, first and second memory cells each having a charge storage layer and a control gate electrode, which are disposed above the semiconductor substrate, a first word line which is connected to the control gate electrode of the first memory cell, a second word line which is connected to the control gate electrode of the second memory cell, a potential transfer line which is connected to both of the first and second word lines, a first N-channel MOS transistor which is connected between the first word line and the potential transfer line, a second N-channel MOS transistor which is connected between the second word line and the potential transfer line, and a control circuit which supplies a first potential with a plus value to the semiconductor substrate, and which supplies a ground potential to the potential transfer line, to turn the first N-channel MOS transistor on, and to turn the second N-channel MOS transistor off by supplying a second potential with a minus value to a gate electrode of the second N-channel MOS transistor, in a data erasing to the first memory cell.

BRIEF DESCRIPTION OF THE SEVERAL VIEWS OF THE DRAWING

FIG. 2 is a view showing a memory cell array and a word line driver.

FIG. 5 is a view showing a layout of transfer transistor unit.

FIGS. 7 and 8 are views, each showing a potential relationship in an erasing of a first example.

FIG. 11 is a view showing a potential relationship of a high breakdown voltage transistor which turns off in a conventional example.

FIG. 14 is a view showing a potential relationship of a high breakdown voltage transistor which turns off in the second example.

FIG. 15 is a view showing a potential relationship of a high breakdown voltage transistor which turns on in the second example.

FIG. 17 is a view showing a potential relationship of a high breakdown voltage transistor which turns off in the third example.

FIG. 18 is a view showing a potential relationship of a high breakdown voltage transistor which turns on in the third example.

FIG. 21 is a wave form chart showing a wave form in a second example.

FIG. 22 is a wave form chart showing a wave form in a third example.

DETAILED DESCRIPTION OF THE INVENTION

Figure 1:
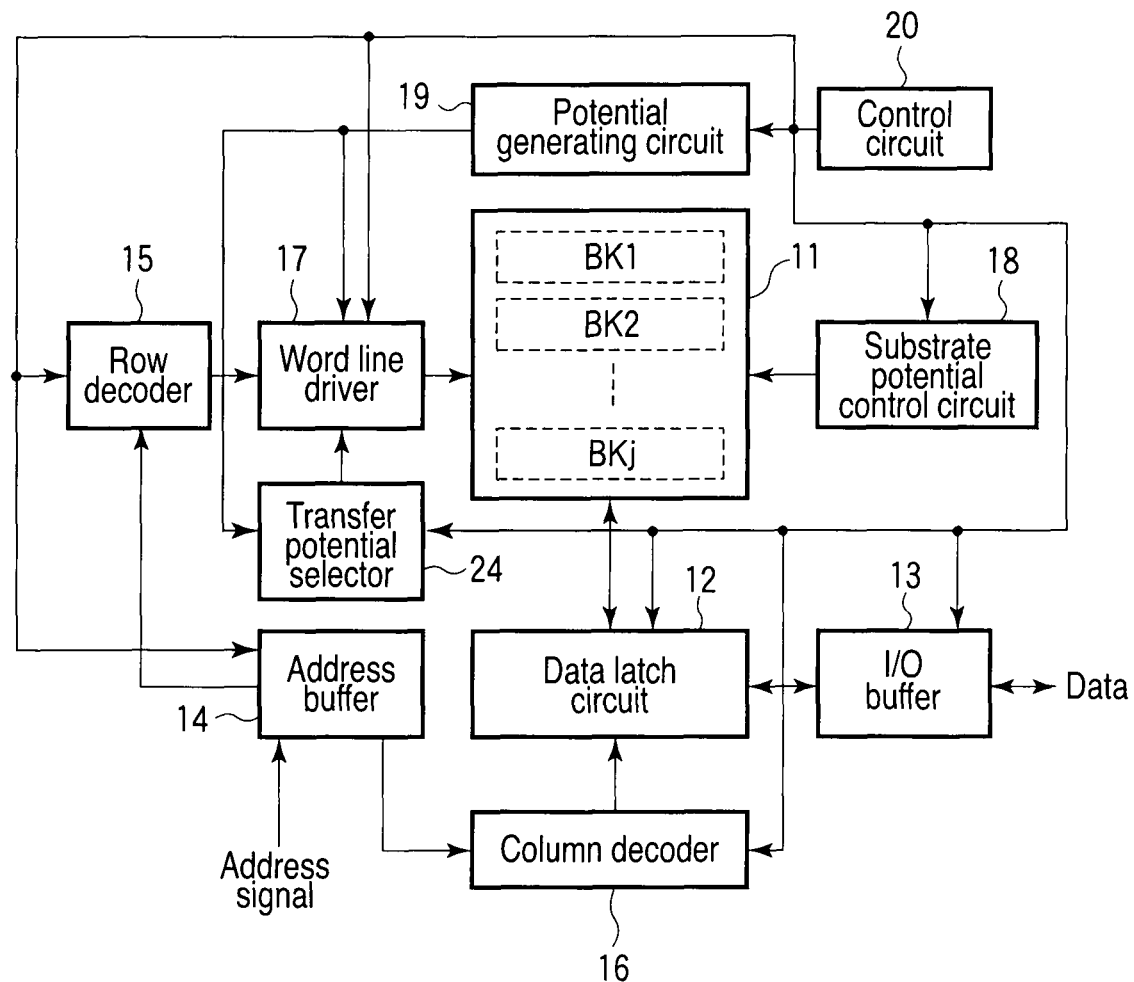
FIG. 1 is an overall view showing a NAND type flash memory.

A semiconductor memory of an aspect of the present invention will be described below in detail with reference to the accompanying drawings.

1. Outline

In a nonvolatile semiconductor memory according to an embodiment of the present invention, electrons are emitted from the charge storage layer to the channel portion, or holes are injected from the channel portion into the charge storage layer, thereby performing the data erasing.

In the nonvolatile semiconductor memory, a first word line and a second word line are commonly connected to a potential transfer line via a first N-channel MOS transistor and a second N-channel MOS transistor. The first word line is connected to a first memory cell as a data erasing target, and the second word line is connected to a second memory cell not as the data erasing target.

The first N-channel MOS transistor whose diffusion layer is connected to the first word line and the potential transfer line is turned on, and the second N-channel MOS transistor whose diffusion layer is connected to the second word line and potential transfer line is turned off, thereby the data of the first memory cell among the first and second memory cells is only erased.

In the embodiment of the present invention, during the data erasing the first memory cell, a positive first potential is applied to a semiconductor substrate, and a positive second potential that is lower than the first potential is applied to the potential transfer line, whereby the improvement of the reliability is achieved by suppressing the electron trap in the gate insulating film of the second N-channel MOS transistor or in the interface of the semiconductor substrate and the source/drain diffusion layer.

During the data erasing the first memory cell, the positive first potential is applied to the semiconductor substrate, the ground potential is applied to the potential transfer line, and the negative second potential is applied to a gate electrode of the second N-channel MOS transistor, whereby the improvement of the reliability is achieved by suppressing the electron trap in the gate insulating film of the second N-channel MOS transistor or in the interface of the semiconductor substrate and the source/drain diffusion layer.

At this point, the semiconductor substrate includes a well region. For example, the embodiment of the present invention is aimed at both a high-potential transfer N-channel MOS transistor formed on a P-type semiconductor substrate and a high-potential transfer N-channel MOS transistor formed on a P-type well region.

Materials for the gate electrode and gate insulating film are not limited in the MOS transistor. Usually the gate electrode is made of conductive polysilicon, and the gate insulating film is made of oxide silicon. However, the materials for the gate electrode and gate insulating film are not limited to the conductive polysilicon and the oxide silicon.

2. Difference between Present Invention and Conventional Technique

There is well known a technique of applying a back gate bias to prevent the punch-through leakage during cut-off of the MOS transistor (for example, Jpn. Pat. Appln. KOKAI Publication Nos. 2-196469 and 2007-281267).

The embodiment of the present invention proposes a technique of preventing the punch-through leakage more easily than the back gate bias during the cut-off. That is, the back gate bias is applied to the MOS transistors by which the semiconductor substrate or the well is shared, and thresholds of the MOS transistor increase.

A word line driver of a nonvolatile semiconductor memory has a circuit characteristic in which a source of a high-breakdown-voltage type MOS transistor connected to the memory cell as the data erasing target and a source of a high-breakdown-voltage type MOS transistor connected to the memory cell not as the data erasing target. And both of the high-breakdown-voltage type MOS transistors are connected to a common potential transfer line.

The embodiment of the present invention is an extremely effective technique in which the punch-through leakage is prevented instead of the back gate bias during the cut-off of the MOS transistor by utilizing the circuit characteristic.

However, obviously the embodiment of the present invention may be used while combined with the back gate bias.

3. Embodiments (1) Overall View

FIG. 1 is an overall view showing a NAND type flash memory.

Memory cell array 11 includes blocks BK1, BK2, ..., and BKj. Each of blocks BK1, BK2, ..., and BKj includes cell units, and each of the cell units includes a NAND string and two select gate transistors. The NAND string includes series-connected memory cells (memory cell transistors). The select gate transistors are connected to both ends of the NAND string, respectively.

Data latch circuit 12 has a function of tentatively latching data during the programming/writing. For example, data latch circuit 12 includes a flip-flop circuit. Input/Output (I/O) buffer 13 acts as a data interface circuit, address buffer 14 acts as an address signal interface circuit.

An address signal includes a block address signal, a row address signal, and a column address signal.

Row decoder 15 selects one of blocks BK1, BK2, ..., and BKj based on the block address signal, and row decoder 15 selects one of the word lines in the selected block based on the row address signal. Word line driver 17 drives the word lines in the selected block.

Column decoder 16 selects one of the bit lines based on the column address signal.

Substrate potential control circuit 18 controls a potential at a semiconductor substrate. Specifically, a double well region including an N-type well region and a P-type well region is formed in a P-type semiconductor substrate. When the memory cell is formed in the P-type well region, the potential at the P-type well region is controlled according to an operation mode.

For example, the potential of the P-type well region is set to zero during the programming/writing, and to 15 V to 40 V during the erasing.

Potential generating circuit 19 generates a potential used to control word line driver 17 and a transfer potential transferred to the word lines of memory cell array 11.

Transfer potential selector 24 selects the transfer potential supplied to each of the word lines of memory cell array 11 based on the operation mode and a position of the selected word line, and supplies the transfer potential to the word lines through word line driver 17.

For example, during the data programming, a programming potential is supplied to the selected word line of the selected block, and a potential that is lower than the programming potential is supplied to the non-selected word line of the selected block. During the data reading, a reading potential is supplied to the selected word line of the selected block according to the data in the cell, and a potential is supplied to the non-selected word line of the selected block to turn on the cell transistor irrespective of the data in the cell. During the data erasing, for example, the ground potential (0 V) is supplied to all the word lines of the selected block.

Control circuit 20 controls operations of peripheral circuits such as data latch circuit 12, I/O buffer 13, address buffer 14, row decoder 15, word line driver 17, substrate potential control circuit 18, potential generating circuit 19, and transfer potential selector 24.

(2) Memory Cell Array and Word Line Driver

FIG. 2 shows a memory cell array and a word line driver of a NAND type flash memory.

Memory cell array 11 includes NAND blocks BK1, BK2, ... disposed in a column direction. Each of NAND blocks BK1, BK2, ... includes cell units disposed in a row direction.

Each of the cell units includes a NAND string and two select gate transistors ST. The NAND string includes series-connected memory cells MC. Select gate transistors ST are connected to both ends of the NAND string, respectively.

Figure 3:
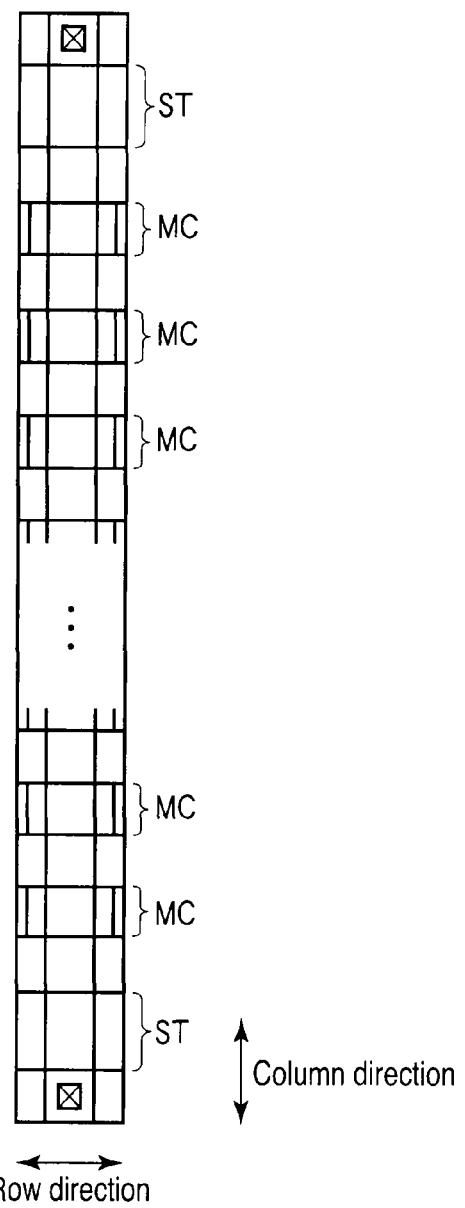
FIGS. 3 and 4 are plane views, each showing a cell unit.
Figure 4:
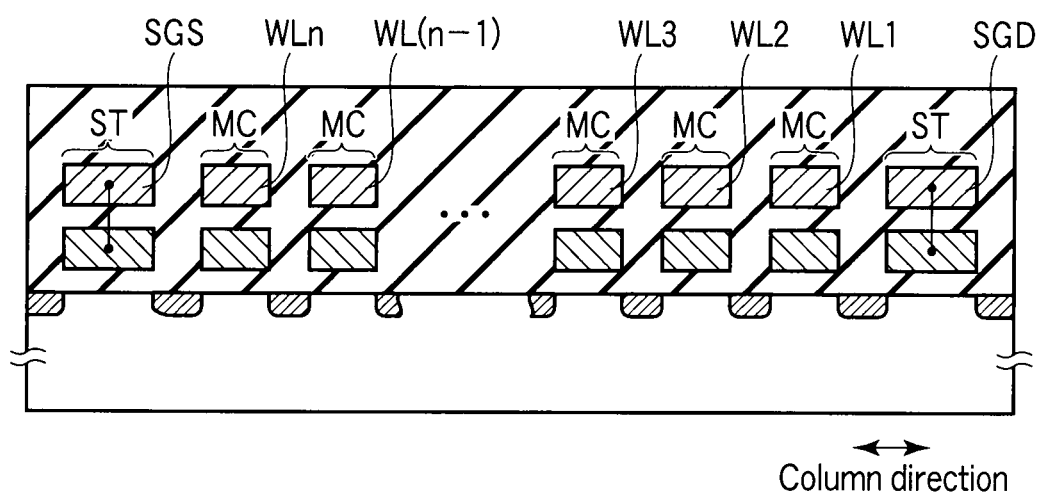

For example, the cell unit has a layout of FIG. 3. For example, the cell unit has a sectional structure in the column direction as shown in FIG. 4.

One end of the cell unit is connected to bit lines BL1, BL2, ..., BL(m−1), and BLm, and the other end is commonly connected to source line SL.

Word lines WL1, WL2, ..., WL(n−1), and WLn and select gate lines SGS and SGD are disposed on memory cell array 11.

For example, n (n is a plural number) word lines WL1, WL2, ..., WL(n−1), and WLn and two select gate lines SGS and SGD are disposed in NAND block BK1.

Word lines WL1, WL2, ..., WL(n−1), and WLn and select gate lines SGS and SGD of NAND block BK1 are extended in the row direction and connected to transfer transistor unit 21 (BK1) of word line driver 17 (DRV1). Control gate electrodes of memory cells MC adjacent to each other in the row direction are commonly connected to each of word lines WL1, WL2, ..., WL(n−1), and WLn. Gate electrodes of select gate transistors ST adjacent to each other in the row direction are commonly connected to each of select gate lines SGS and SGD.

Transfer transistor unit 21 (BK1) includes N-channel MOS transistors Tr11 to Trn1, and ends of diffusion layers of N-channel MOS transistor are connected to potential transfer lines (control gate lines) CG1, CG2, ..., CG(n−1), CGn, SGSV, and SGDV, respectively. The other end of the diffusion layer is connected to each of word lines WL1, WL2, ..., WL(n−1), and WLn and select gate lines SGS and SGD. The gate electrodes of each N-channel MOS transistor are commonly connected in each transfer transistor unit 21.

Potential transfer lines CG1, CG2, ..., CG(n−1), CGn, SGSV, and SGDV are extended in the column direction intersecting the row direction and connected to transfer potential selector 24.

The N-channel MOS transistor of transfer transistor unit 21 (BK1) is a high-breakdown-voltage type N-channel MOS transistor so as to transfer a potential that is higher than a power-supply potential. However, the N-channel MOS transistor connected to select gate lines SGS and SGD may be a low-breakdown-voltage type MOS transistor, because a high voltage is not applied to the N-channel MOS transistors connected to select gate lines SGS and SGD.

Booster 22-1 of word line driver 17 (DRV1) receives a decode signal supplied from row decoder 15.

For example, booster 22-1 formed in word line driver 17 (DRV1) is connected to the gate electrode of the N-channel MOS transistor disposed in transfer transistor unit 21 (BK1), booster 22-1 generates a potential to turn the N-channel MOS transistor disposed in transfer transistor unit 21 (BK1) on, when NAND block BK1 is selected. And booster 22-1 generates a potential to turn the N-channel MOS transistor disposed in transfer transistor unit 21 (BK1) off, when NAND block BK1 is not selected.

Similarly n (n is a plural number) word lines WL1, WL2, ..., WL(n−1), and WLn and two select gate lines SGS and SGD are disposed in NAND block BK2.

Word lines WL1, WL2, ..., WL(n−1), and WLn and select gate lines SGS and SGD of NAND block BK2 are extended in the row direction and connected to transfer transistor unit 21 (BK2) of word line driver 17 (DRV2). The control gate electrodes of memory cells MC adjacent to each other in the row direction are commonly connected to each of word lines WL1, WL2, ..., WL(n−1), and WLn. The gate electrodes of select gate transistors ST adjacent to each other in the row direction are commonly connected to each of select gate lines SGS and SGD.

Transfer transistor unit 21 (BK2) includes N-channel MOS transistors Tr11 to Trn1, and ends of the diffusion layers of the N-channel MOS transistor are connected to potential transfer lines (control gate lines) CG1, CG2, . . . , CG(n−1), CGn, SGSV, and SGDV, respectively. The other end of the diffusion layer is connected to each of word lines WL1, WL2, . . . , WL(n−1), and WLn and select gate lines SGS and SGD. The gate electrodes of each N-channel MOS transistor are commonly connected in each transfer transistor unit 21.

That is, potential transfer lines CG1 is commonly connected to the ends of the diffusion layers of N-channel MOS transistors Tr11, Tr12. And potential transfer lines CG2 is commonly connected to the ends of the diffusion layers of N-channel MOS transistors Tr21, Tr22 . . . . And potential transfer lines CGn is commonly connected to the ends of the diffusion layers of N-channel MOS transistors Trn1, Trn2.

The N-channel MOS transistor of transfer transistor unit 21 (BK2) is the high-breakdown-voltage type N-channel MOS transistor so as to transfer the potential that is higher than the power-supply potential. However, the N-channel MOS transistor connected to select gate lines SGS and SGD may be the low-breakdown-voltage type MOS transistor, because the high voltage is not applied to the N-channel MOS transistors connected to select gate lines SGS and SGD.

Booster 22-2 of word line driver 17 (DRV2) receives the decode signal supplied from row decoder 15.

For example, booster 22-2 formed in word line driver 17 (DRV2) is connected to the gate electrode of the N-channel MOS transistor disposed in transfer transistor unit 21 (BK2), booster 22-2 generates the potential to turn the N-channel MOS transistor disposed in transfer transistor unit 21 (BK2) on, when NAND block BK2 is selected. And booster 22-2 generates the potential to turn the N-channel MOS transistor disposed in transfer transistor unit 21 (BK2) off, when NAND block BK2 is not selected.

FIG. 5 shows a layout of the N-channel MOS transistor included in the transfer transistor unit in the word line driver.

Each of NAND strings 23 of NAND blocks BK1, BK2, . . . includes series-connected memory cells. FIG. 5 shows an example in which NAND string 23 includes six memory cells. In such cases, six word lines WL1, WL2, . . . , and WL6 are disposed in one block.

Word lines WL1, WL2, . . . , and WL6 are formed in an interconnection layer on the semiconductor substrate.

In one end side of memory cell array 11, transfer transistor units 21(BK1), (BK2), . . . are disposed according to blocks BK1, BK2, . . . .

Six N-channel MOS transistors Tr11 to Tr61 of transfer transistor unit 21 (BK1) are arrayed in the row direction, and the drains of N-channel MOS transistors Tr11 to Tr61 are connected to six word lines WL1, WL2, . . . , and WL6 of NAND block BK1, respectively. Although the gate electrodes of N-channel MOS transistors Tr11 to Tr61 are decoupled in FIG. 5, the gate electrodes are commonly connected by an upper interconnection (not shown).

Similarly six N-channel MOS transistors Tr12 to Tr62 of transfer transistor unit 21 (BK2) are arrayed in the row direction, and the drains of N-channel MOS transistors Tr12 to Tr62 are connected to six word lines WL1, WL2, . . . , and WL6 of NAND block BK2, respectively. Although the gate electrodes of N-channel MOS transistors Tr12 to Tr62 are decoupled in FIG. 5, the gate electrodes are commonly connected by an upper interconnection (not shown).

Six potential transfer lines CG1, CG2, . . . , and CG6 are disposed on transfer transistor units 21 (BK1), (BK2), . . . .

The sources of six N-channel MOS transistors Tr11 to Tr61 of transfer transistor unit 21 (BK1) are connected to six potential transfer lines CG1, CG2, . . . , and CG6 through conductive line 25, respectively. Similarly the sources of six N-channel MOS transistors Tr12 to Tr62 of transfer transistor unit 21 (BK2) are connected to six potential transfer lines CG1, CG2, . . . , and CG6 through conductive line 25, respectively.

The sources of N-channel MOS transistors Tr11 and Tr12 adjacent to each other in the column direction are connected to the same potential transfer line CG1. Similarly the sources of N-channel MOS transistors Tr21 and Tr22 are connected to the same potential transfer line CG2, the sources of N-channel MOS transistors Tr31 and Tr32 are connected to the same potential transfer line CG3, the sources of N-channel MOS transistors Tr41 and Tr42 are connected to the same potential transfer line CG4, the sources of N-channel MOS transistors Tr51 and Tr52 are connected to the same potential transfer line CG5, and the sources of N-channel MOS transistors Tr61 and Tr62 are connected to the same potential transfer line CG6.

The gate electrodes of N-channel MOS transistors Tr11 to Trn2 are formed on the semiconductor substrate with a gate insulating film interposed therebetween. The semiconductor substrate may be replaced by a P well formed in the semiconductor substrate. At this point, N-channel MOS transistors Tr11 to Trn2 are formed on one continuous P well (PW) or the semiconductor substrate with the gate insulating film interposed therebetween.

Figure 6:
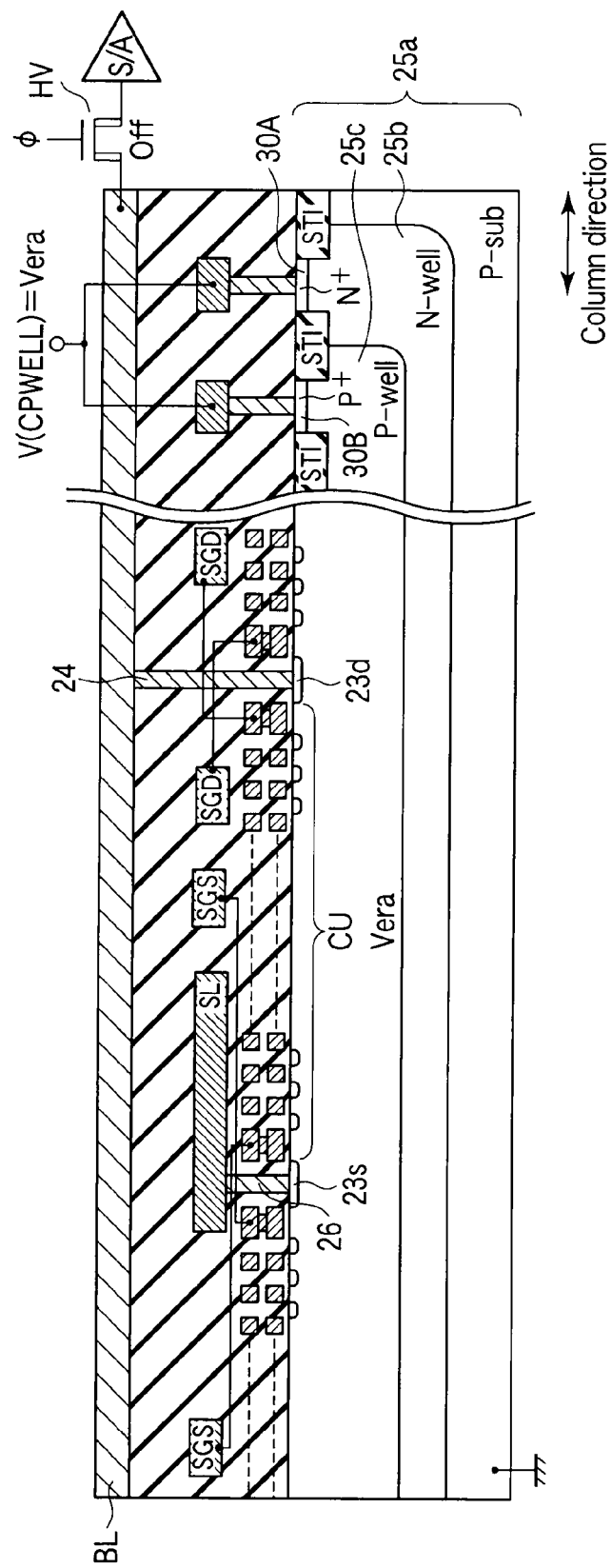
FIG. 6 is a cross-sectional view in a column direction of a memory cell array.

FIG. 6 is a sectional view showing a memory cell array in the column direction.

A double well region including P-type well region $25c$ and N-type well region $25b$ is formed in P-type silicon substrate $25a$. P-type well region $25c$ is formed in P-type silicon substrate $25a$. N-type well region $25b$ is formed such that P-type well region $25c$ is covered therewith.

One end of cell unit CU, that is, a drain diffusion layer of a select gate transistor is connected to bit line BL. Bit line BL is connected to sense amplifier S/A through the high-breakdown-voltage type N-channel MOS transistor.

The other end of cell unit CU, that is, a source diffusion layer of the select gate transistor is connected source line SL.

N-type well region $25b$ is connected to potential setting line PL through $N^+$-type contact layer 30A, and P-type well region $25c$ is connected to potential setting line PL through $P^+$-type contact layer 30B. For example, potential setting line PL is connected to a substrate potential control circuit.

(3) Potential Relationship During Data Erasing

As described above in the outline, a main part of the present invention lies in the potential relationship during the data erasing. The potential relationship during the data erasing in the NAND type flash memory of FIGS. 1 to 6 will be described in detail with reference to the circuit diagram of FIG. 2.

All the following drawings correspond to FIG. 2, the meaning of the numeral used in the drawings is identical to that of FIG. 2.

It is assumed that the data erasing is performed to memory cell MC of NAND block BK1 in NAND blocks BK1, BK2, . . . while the data erasing is not performed to the memory cells MC of NAND blocks BK2, . . . .

A. First Embodiment

As shown in FIG. 7, boosters 22-1, 22-2, supply boost potential Vboost to apply power-supply voltage (Vdd) to the gate electrodes of N-channel MOS transistors Tr11 to Trn2 so as to turn the N-channel MOS transistors of transfer transistor units 21 (BK1), 21 (BK2), . . . on.

At this point, well potentials at N-channel MOS transistors Tr11 to Trn2 of transfer transistor units 21 (BK1) and 21 (BK2) or the potential at P-type silicon substrate 25a is set to the ground potential (0 V). In a preferred embodiment, boost potential Vboost is a voltage at which positive potential Vadd can be transferred from the source to the drain.

Because the transfer potential selector 24 supplies the ground potential (0 V) to potential transfer lines CG1, CG2, CG(n−1), and CGn, the ground potential is transferred to word lines WL1, WL2, WL(n−1), and WLn of NAND blocks BK1, BK2, . . . through transfer transistor units 21 (BK1), 21 (BK2), . . . .

Then, for example, the voltage of 0 V is applied to the gate electrodes of N-channel MOS transistors Tr12 to Trn2 such that output potentials at the boosters 22-2, . . . corresponding to all NAND blocks BK2, . . . except for NAND block BK1 that becomes the data erasing target is changed from boost potential Vboost to the ground potential (0 V) to turn N-channel MOS transistors Tr12 to Trn2 of transfer transistor units 21 (BK2), . . . off.

At this point, word lines WL1, WL2, WL(n−1), and WLn of NAND block BK1 that becomes the data erasing target are fixed to the ground potential, and word lines WL1, WL2, WL(n−1), and WLn of remaining NAND blocks BK2, . . . that do not become the data erasing target become a floating state at the ground potential.

On the other hand, because potential transfer lines CG1, CG2, . . . , CG(n−1), and CGn are connected to the sources of N-channel MOS transistors Tr11 to Trn2 of transfer transistor units 21 (BK1) and 21 (BK2), the sources and drains of N-channel MOS transistors Tr11 to Trn2 become 0 V.

At this point, the potential at P-type well region 25c in which NAND blocks BK1, BK2, . . . are formed is the ground potential. That is, the ground potential (0 V) is applied to well contact (P$^+$-type contact layer) 30B.

As shown in FIG. 8, transfer potential selector 24 supplies positive potential (for example, 0.5 V) Vadd to potential transfer lines CG1, CG2, . . . , CG(n−1), and CGn. Positive potential Vadd is transferred to word lines WL1, WL2, WL(n−1), and WLn of NAND block BK1 that becomes the data erasing target through transfer transistor unit 21 (BK1). That is, both the source and drain potentials of N-channel MOS transistors Tr11 to Trn1 become Vadd.

On the other hand, because potential transfer lines CG1, CG2, . . . , CG(n−1), and CGn are also connected to the source of transfer transistor unit 21 (BK2), the source potentials at N-channel MOS transistors Tr12 to Trn2 become positive potential Vadd. Because N-channel MOS transistors Tr12 to Trn2 are in the off state, the drain potentials at N-channel MOS transistors Tr12 to Trn2 are kept at 0 V.

Then the potential at the P-type well region in which NAND blocks BK1, BK2, . . . are formed is raised from the ground potential to positive high potential (Vera+Vadd) through well contact (P$^+$-type contact layer) 30B.

At this point, Vera is a potential of 15 V to 40 V (for example, about 24 V), which is necessary for the data erasing. Vadd is identical to positive potential Vadd applied to potential transfer lines CG1, CG2, . . . , CG(n−1), and CGn. Vera can be obtained by subtracting source potential (Vadd) at the N-channel MOS transistors Tr11 to Trn2 from potential (Vera+Vadd) at P-type well region 25c.

In memory cell MC of NAND block BK1, because word lines WL1, WL2, WL(n−1), and WLn become Vadd while the channel portion (P-type well region 25c) becomes (Vera+Vadd), electrons are emitted from the charge storage layer to the channel portion, or holes are injected from the channel portion into the charge storage layer, thereby performing the data erasing.

On the other hand, in memory cells MC of NAND blocks BK2, . . . , when the P-type well region is raised from the ground potential to positive high potential (Vera+Vadd), word lines WL1, WL2, WL(n−1), . . . , and WLn in the floating state are raised from the ground potential to about (Vera+Vadd) by the capacitive coupling.

Accordingly, the data erasing is not performed to memory cells MC of NAND blocks BK2, . . . .

During the data erasing, positive potential Vadd is applied to the sources of the N-channel MOS transistors in the cut-off state in transfer transistor units 21 (BK2), . . . of word line drivers 17 (DRV2), . . . , and the high potential of about (Vera+Vadd) is applied to the drain of the N-channel MOS transistors.

Figure 9:
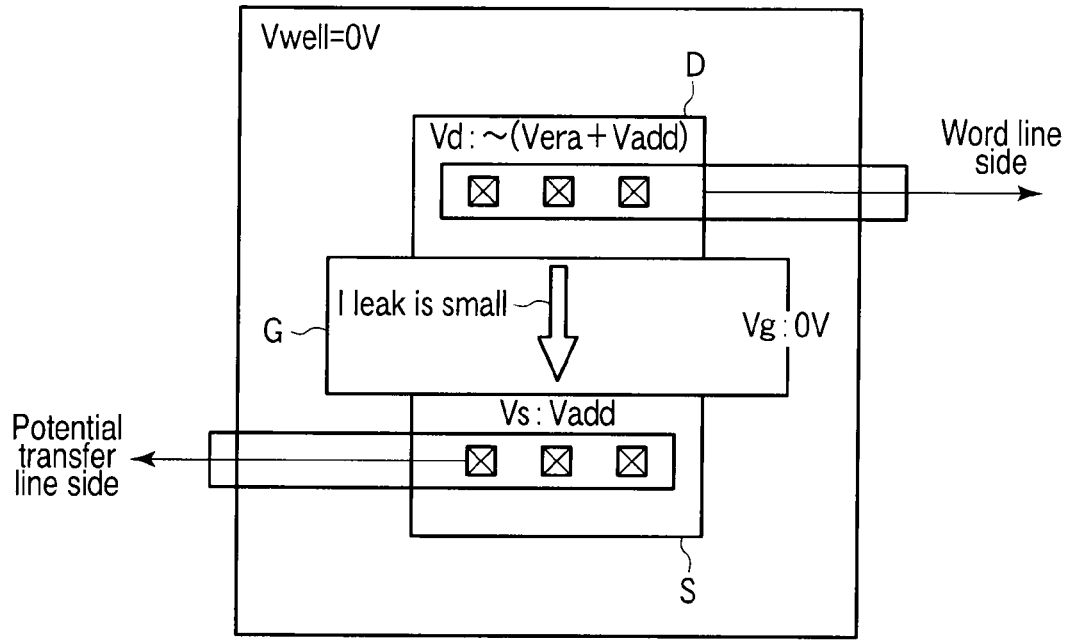
FIG. 9 is a view showing a potential relationship of a high breakdown voltage transistor which turns off in the first example.
Figure 10:
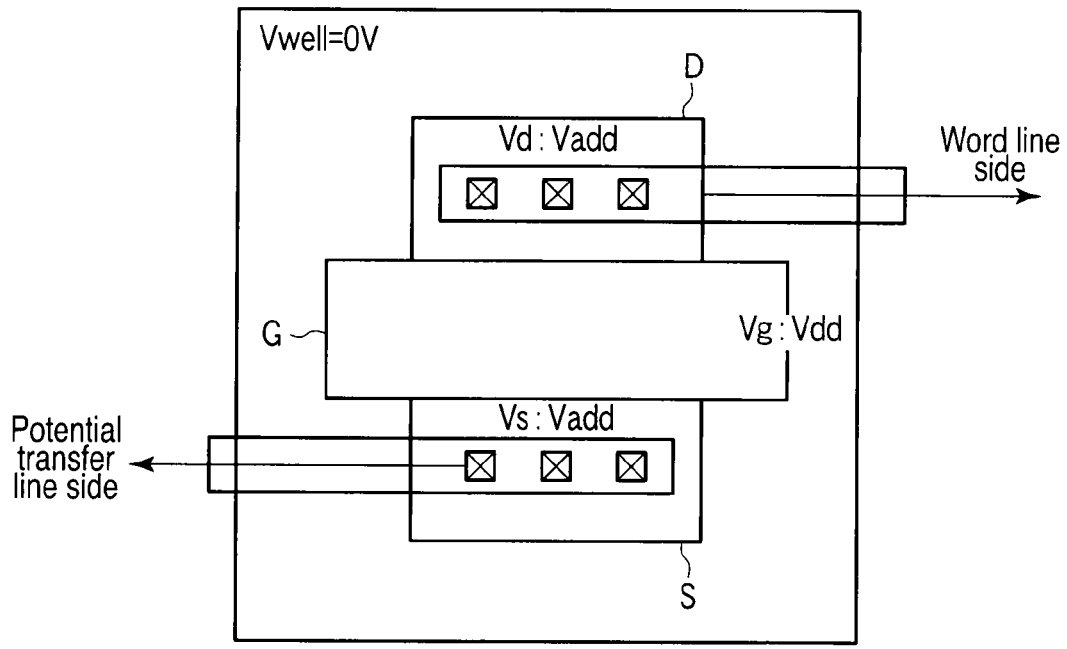
FIG. 10 is a view showing a potential relationship of a high breakdown voltage transistor which turns on in the first example.

FIG. 9 shows a potential relationship among N-channel MOS transistors Tr12 to Trn2, and FIG. 10 shows a potential relationship among N-channel MOS transistors Tr11 to Trn1.

As shown in FIG. 9, potential Vg at gate G is set to 0 V, well potential Vwell is set to 0 V, potential Vs at source S is set to Vadd, and potential Vd at drain D is set to about (Vera+Vadd).

The potential relationship of the first embodiment differs from that of the conventional technique in that potential Vs (=Vadd) at source S is larger than potential Vg (=0 V) at gate G. Therefore, the potential relationship of the first embodiment is equivalent to a state in which the back gate bias of −0.5 V is applied to the well. Leakage current (electrons flow inverse direction) Ileak from drain D to source S is reduced, and electrons are not trapped in the gate insulating film or the interface state.

Therefore, the reliability of the N-channel MOS transistor can be improved in the transfer transistor unit.

As shown in FIG. 10, potential Vg at gate G is set to power-supply voltage (Vdd), well potential Vwell is set to 0 V, potential Vs at source S is set to Vadd, and potential Vd at drain D is set to about Vadd.

Vadd is transferred from source to the drain because N-channel MOS transistors Tr11 to Trn1 are in the on state, and therefore an electric field between the charge storage layer and the P-type well region is increased in memory cell MC of NAND block BK1. That is, the voltage of Vera applied between the control gate electrode and channel portion of memory cell MC is not changed by setting channel portion (P-type well region) to (Vera+Vadd). Therefore, the data erasing can be performed without problems.

FIG. 11 shows a conventional potential relationship among the N-channel MOS transistor in the cut-off state as a comparative example.

Potential Vg at gate G is set to 0 V, well potential Vwell is set to 0 V, potential Vs at source S is set to 0 V, and potential Vd at drain D is set to about Vera.

Figure 12:
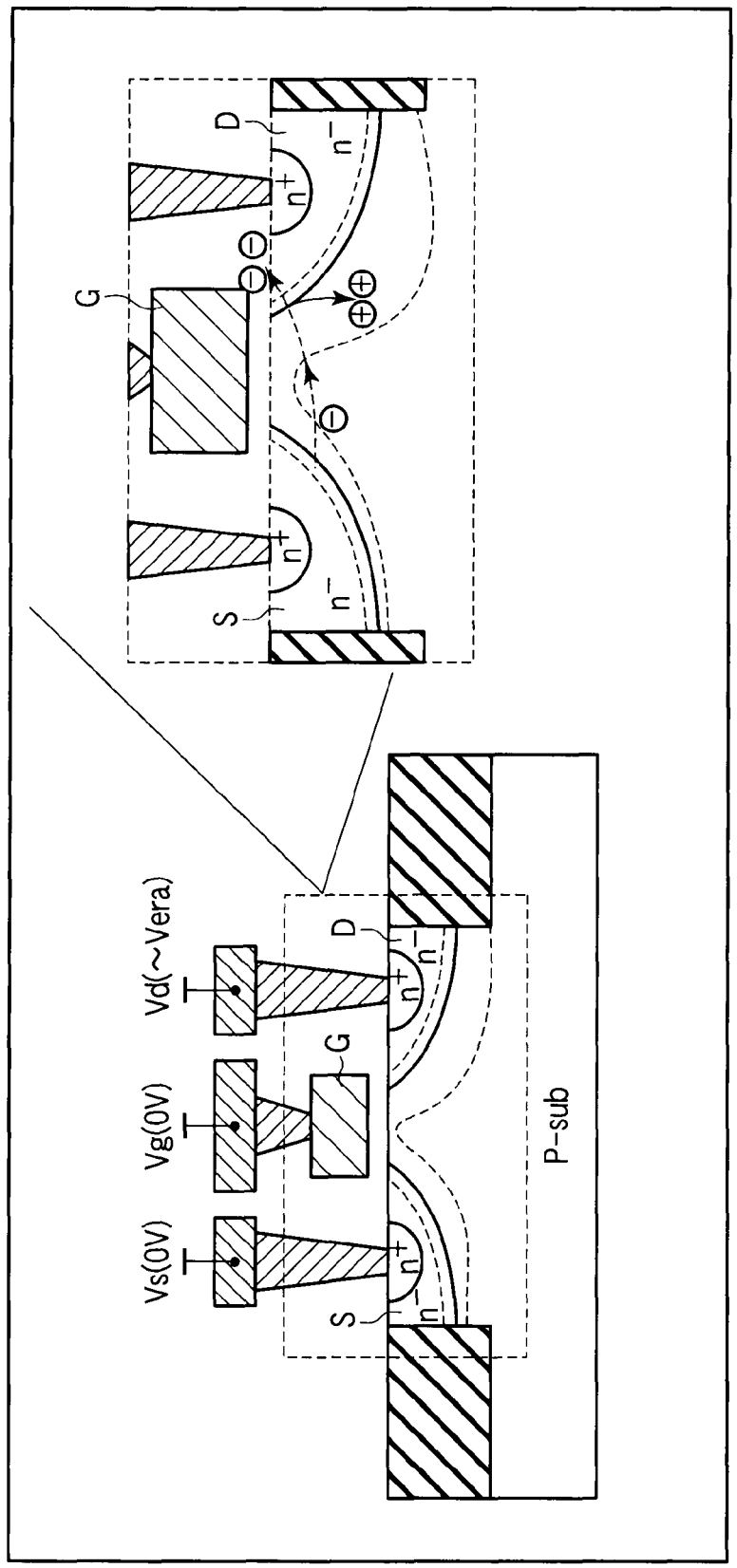
FIG. 12 is a view showing a punch through leakage.

At this point, as shown in FIG. 12, potential Vs (=0 V) at source S is identical to potential Vg (=0 V) at gate G, and voltage (Vera-0 V) is applied between the source and the drain. Therefore, leakage current Ileak from source S to drain D is increased, and electrons become hot electrons to be trapped in the gate insulating film or the interface state.

That is, the leakage current generated in the N-channel MOS transistors in the cut-off state in transfer transistor units 21 (BK2), . . . in word line drivers 17 (DRV2), . . . are prevented by applying positive potential Vadd to potential transfer lines CG1, CG2, . . . , CG(n−1), and CGn at the first embodiment.

Because the potential is not applied to the well of the N-channel MOS transistor, it is not necessary to consider threshold fluctuations of other N-channel transistors. For example, when the thresholds of other N-channel transistors in word line drivers 17(DRV1) are raised, the bit line BL cannot be selected, which possibly causes the programming/reading error. Therefore, the first embodiment is effectively applied when the N-channel transistor, in which a high-speed operation and a lowered threshold are required, is formed on the same well or P-type silicon substrate 25a.

B. Second Embodiment

As shown in FIG. 7, boosters 22-1, 22-2, ... supply boost potential Vboost to apply power-supply voltage (Vdd) to the gate electrodes of N-channel MOS transistors Tr11 to Trn2 so as to turn the N-channel MOS transistors of transfer transistor units 21 (BK1), 21 (BK2), ... on.

At this point, well potentials at N-channel MOS transistors Tr11 to Trn2 of transfer transistor units 21 (BK1) and 21 (BK2) or the potential at P-type silicon substrate 25a is set to the ground potential (0 V). In a preferred embodiment, boost potential Vboost is a voltage at which positive potential Vadd can be transferred from the source to the drain.

Because transfer potential selector 24 supplies the ground potential (0 V) to potential transfer lines CG1, CG2, ..., CG(n−1), and CGn, the ground potential is transferred to word lines WL1, WL2, WL(n−1), and WLn of NAND blocks BK1, BK2, ... through transfer transistor units 21 (BK1), 21 (BK2), ....

Then, for example, the voltage of 0 V is applied to the gate electrodes of N-channel MOS transistors Tr12 to Trn2 such that output potentials at boosters 22-2, ... corresponding to all NAND blocks BK2, ... except for NAND block BK1 that becomes the data erasing target are changed from boost potential Vboost to the ground potential (0 V) to turn N-channel MOS transistors Tr12 to Trn2 of transfer transistor units 21 (BK2), ... off.

At this point, word lines WL1, WL2, WL(n−1), and WLn of NAND block BK1 that becomes the data erasing target are fixed to the ground potential, and word lines WL1, WL2, WL(n−1), and WLn of remaining NAND blocks BK2, ... that do not become the data erasing target become a floating state at the ground potential.

On the other hand, because potential transfer lines CG1, CG2, ..., CG(n−1), and CGn are connected to the sources of N-channel MOS transistors Tr11 to Trn2 of transfer transistor units 21 (BK1) and 21 (BK2), the sources and drains of N-channel MOS transistors Tr11 to Trn2 become 0 V.

At this point, the potential at P-type well region 25c in which NAND blocks BK1, BK2, ... are formed is the ground potential. That is, the ground potential (0 V) is applied to well contact (P⁺-type contact layer) 30B.

Figure 13:
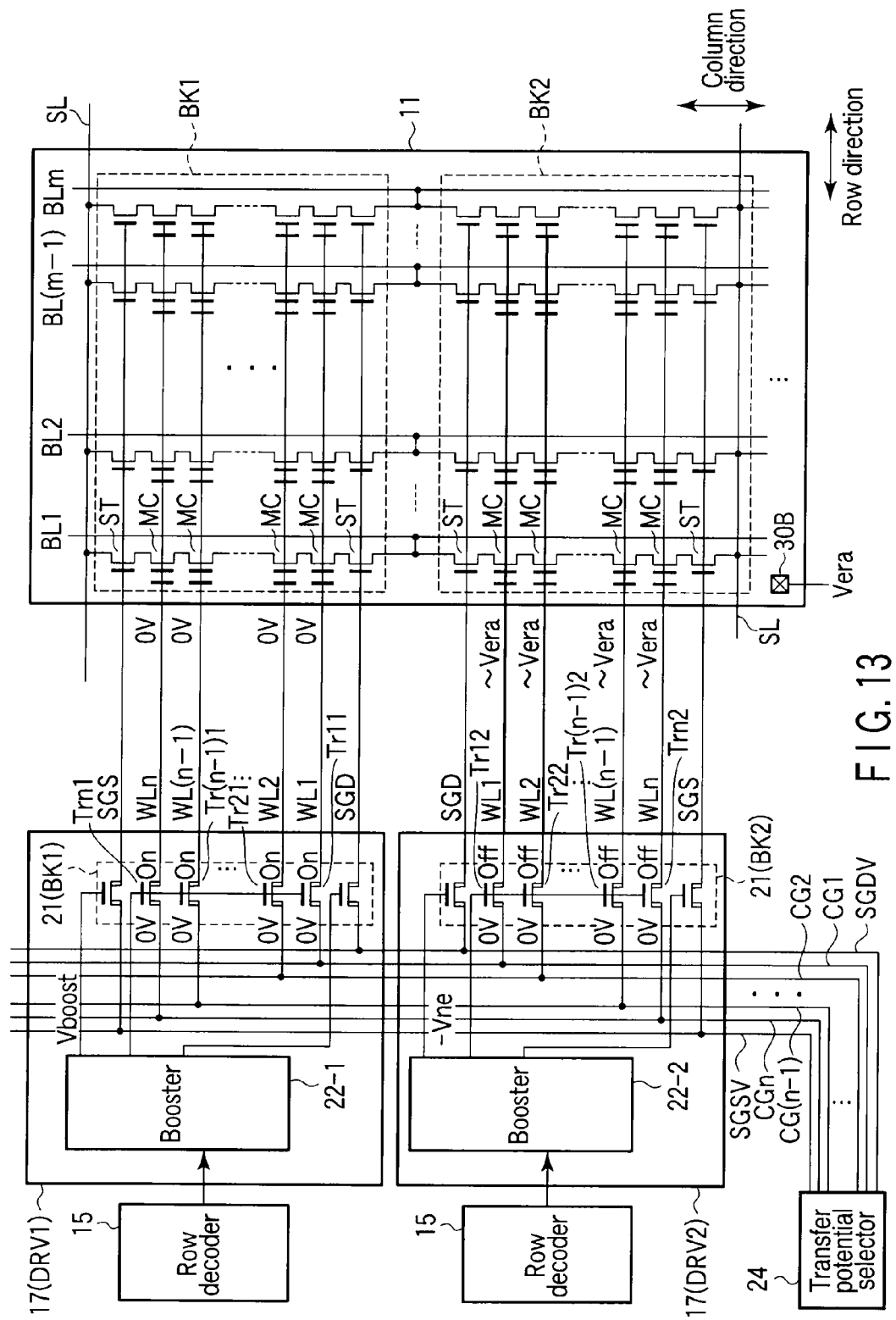
FIG. 13 is a view showing a potential relationship in an erasing of a second example.

As shown in FIG. 13, boosters 22-2, ... of word line drivers 17 (DRV2), ... corresponding to NAND blocks BK2, ... that do not become the data erasing target supply negative potential (for example, −1 V) −Vne. Negative potential −Vne is applied to the gates of the N-channel MOS transistors of transfer transistor units 21 (BK2), ....

Then the potential at the P-type well region in which NAND blocks BK1, BK2, ... are formed is raised from the ground potential to positive high potential Vera through well contact (P⁺-type contact layer) 30B.

At this point, Vera is a potential of 15 V to 40 V (for example, about 24 V), which is necessary for the data erasing.

In memory cell MC of NAND block BK1, because word lines WL1, WL2, WL(n−1), and WLn become the ground potential while the channel portion (P-type well region 25c) becomes Vera, electrons are emitted from the charge storage layer to the channel portion, or holes are injected from the channel portion into the charge storage layer, thereby performing the data erasing.

On the other hand, in memory cells MC of NAND blocks BK2, ..., when the P-type well region is raised from the ground potential to positive high potential Vera, word lines WL1, WL2, WL(n−1), ..., and WLn in the floating state are raised from the ground potential to about Vera by the capacitive coupling.

Accordingly, the data erasing is not performed to memory cells MC of NAND blocks BK2, ....

During the data erasing, the ground potential (0 V) is applied to the sources of the N-channel MOS transistors in the cut-off state in transfer transistor units 21 (BK2), ... of word line drivers 17 (DRV2), ..., and the high potential of about Vera is applied to the drain of the N-channel MOS transistors in transfer transistor units 21 (BK2).

FIG. 14 shows a potential relationship among N-channel MOS transistors Tr12 to Trn2, and FIG. 15 shows a potential relationship among N-channel MOS transistors Tr11 to Trn1.

As shown in FIG. 14, potential Vg at gate G is set to −Vne, well potential Vwell is set to 0 V, potential Vs at source S is set to 0 V, and potential Vd at drain D is set to about Vera.

The potential relationship of the second embodiment differs from that of the conventional technique in that potential Vs (=0 V) at source S is smaller than potential Vg (=−Vne) at gate G.

Because the state of Vg=−Vne is better than the state of Vg=0 V in the cut-off characteristic, leakage current (electrons flow inverse direction) Ileak from drain D to source S is reduced, and electrons are not trapped in the gate insulating film or the interface state.

Therefore, the reliability of the N-channel MOS transistor can be improved in the transfer transistor unit.

As shown in FIG. 15, potential Vg at gate G is set to power-supply voltage (Vdd), well potential Vwell is set to 0 V, potential Vs at source S is set to 0 V, and potential Vd at drain D is set to about 0 V.

0 V is transferred to the drain because N-channel MOS transistors Tr11 to Trn1 are in the on state, and therefore the electric field between the charge storage layer and the P-type well region is increased in memory cell MC of NAND block BK1. That is, the voltage of Vera applied between the control gate electrode and channel portion of memory cell MC is not changed by setting channel portion (P-type well region) to Vera, so that the data erasing can be performed without problems.

Therefore, the leakage current generated in the N-channel MOS transistors in word line drivers 17 (DRV2), ... are prevented by applying negative potential −Vne to the gates of the N-channel MOS transistors in the cut-off state in transfer transistor units 21 (BK2), ... in word line drivers 17 (DRV2), ....

As with the first embodiment, because the potential is not applied to the well of the N-channel MOS transistor, it is not necessary to consider threshold fluctuations of other N-channel transistors.

Because the high voltage (Vera+Vadd) is not used, the device is easily designed.

C. Third Embodiment

A third embodiment relates to a combination of the first embodiment and the second embodiment.

As shown in FIG. 7, boosters 22-1, 22-2, ... supply boost potential Vboost to apply power-supply voltage (Vdd) to the gate electrodes of N-channel MOS transistors Tr11 to Trn2 so as to turn the N-channel MOS transistors of transfer transistor units 21 (BK1), 21 (BK2), . . . on.

At this point, well potentials at N-channel MOS transistors Tr11 to Trn2 of transfer transistor units 21 (BK1) and 21 (BK2) or the potential at P-type silicon substrate 25a is set to the ground potential (0 V). In a preferred embodiment, boost potential Vboost is a voltage at which positive potential Vadd can be transferred from the source to the drain.

Because transfer potential selector 24 supplies the ground potential (0 V) to potential transfer lines CG1, CG2, . . . , CG(n−1), and CGn, the ground potential is transferred to word lines WL1, WL2, WL(n−1), and WLn of NAND blocks BK1, BK2, . . . through transfer transistor units 21 (BK1), 21 (BK2), . . . .

Then, for example, the voltage of 0 V is applied to the gate electrodes of N-channel MOS transistors Tr12 to Trn2 such that output potentials at boosters 22-2, . . . corresponding to all NAND blocks BK2, . . . except for NAND block BK1 that becomes the data erasing target are changed from boost potential Vboost to the ground potential (0 V) to turn N-channel MOS transistors Tr12 to Trn2 of transfer transistor units 21 (BK2), . . . off.

At this point, word lines WL1, WL2, WL(n−1), and WLn of NAND block BK1 that becomes the data erasing target are fixed to the ground potential, and word lines WL1, WL2, WL(n−1), and WLn of remaining NAND blocks BK2, . . . that do not become the data erasing target become a floating state at the ground potential.

On the other hand, because potential transfer lines CG1, CG2, . . . , CG(n−1), and CGn are connected to the sources of N-channel MOS transistors Tr11 to Trn2 of transfer transistor units 21 (BK1) and 21 (BK2), the sources and drains of N-channel MOS transistors Tr11 to Trn2 become 0 V.

At this point, the potential at P-type well region 25c in which NAND blocks BK1, BK2, . . . are formed is the ground potential. That is, the ground potential (0 V) is applied to well contact (P⁺-type contact layer) 30B.

Figure 16:
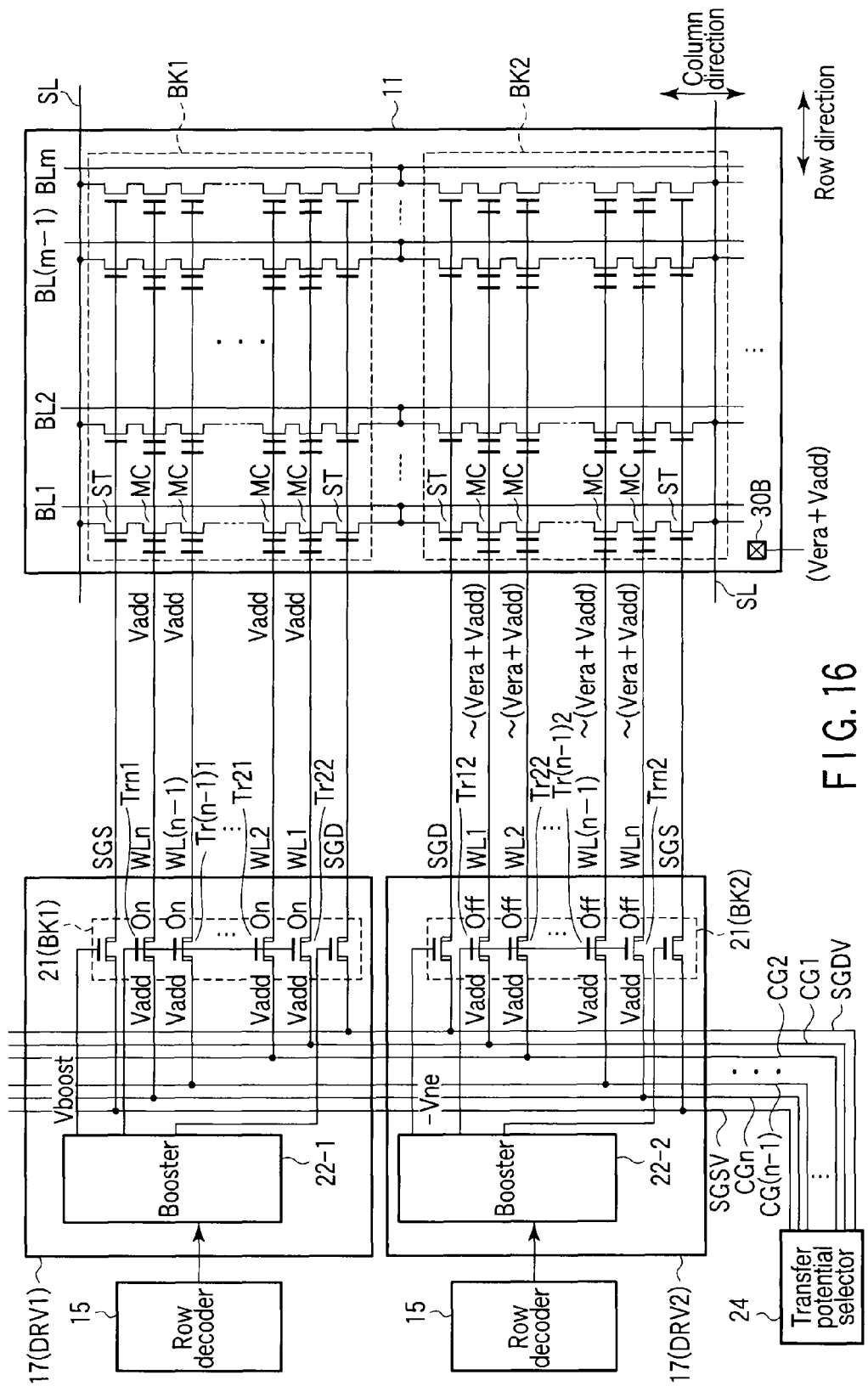
FIG. 16 is a view showing a potential relationship in an erasing of a third example.

As shown in FIG. 16, transfer potential selector 24 supplies positive potential (for example, 0.5 V) Vadd to potential transfer lines CG1, CG2, . . . , CG(n−1), and CGn. Positive potential Vadd is transferred to word lines WL1, WL2, WL(n−1), and WLn of NAND block BK1 that becomes the data erasing target through transfer transistor unit 21 (BK1). That is, both the source and drain potentials of N-channel MOS transistors Tr11 to Trn1 become Vadd.

On the other hand, because potential transfer lines CG1, CG2, . . . , CG(n−1), and CGn are also connected to the source of transfer transistor unit 21 (BK2), the source potentials at N-channel MOS transistors Tr12 to Trn2 become positive potential Vadd. Because N-channel MOS transistors Tr12 to Trn2 are in the off state, the drain potentials at N-channel MOS transistors Tr12 to Trn2 are kept at 0 V.

Because boosters 22-2, . . . of word line drivers 17 (DRV2), . . . corresponding to NAND blocks BK2, . . . that do not become the data erasing target supply negative potential (for example, −1 V) −Vne, negative potential −Vne is applied to the gates of the N-channel MOS transistors of transfer transistor units 2-1(BK2), . . . .

Then the potential at the P-type well region in which NAND blocks BK1, BK2, . . . are formed is raised from the ground potential to positive high potential (Vera+Vadd) through well contact (P⁺-type contact layer) 30B.

At this point, Vera is a potential of 15 V to 40 V (for example, about 24 V), which is necessary for the data erasing. Vadd is identical to positive potential Vadd applied to potential transfer lines CG1, CG2, . . . , CG(n−1), and CGn. Vera can be obtained by subtracting source potential (Vadd) at the N-channel MOS transistors Tr11 to Trn2 from potential (Vera+Vadd) at P-type well region 25c.

In memory cell MC of NAND block BK1, because word lines WL1, WL2, WL(n−1), and WLn become Vadd while the channel portion (P-type well region 25c) becomes (Vera+Vadd), electrons are emitted from the charge storage layer to the channel portion, or holes are injected from the channel portion into the charge storage layer, thereby performing the data erasing.

On the other hand, in memory cells MC of NAND blocks BK2, . . . , when the P-type well region is raised from the ground potential to positive high potential (Vera+Vadd), word lines WL1, WL2, WL(n−1), . . . , and WLn in the floating state are raised from the ground potential to about (Vera+Vadd) by the capacitive coupling.

Accordingly, the data erasing is not performed to memory cells MC of NAND blocks BK2, . . . .

During the data erasing, positive potential Vadd is applied to the sources of the N-channel MOS transistors in the cut-off state in transfer transistor units 21 (BK2), . . . of word line drivers 17 (DRV2), . . . , the high potential of about (Vera+Vadd) is applied to the drain of the N-channel MOS transistors, and negative potential −Vne is applied to the gate of the N-channel MOS transistors.

FIG. 17 shows a potential relationship among N-channel MOS transistors Tr12 to Trn2, and FIG. 18 shows a potential relationship among N-channel MOS transistors Tr11 to Trn1.

As shown in FIG. 17, potential Vg at gate G is set to −Vne, well potential Vwell is set to 0 V, potential Vs at source S is set to Vadd, and potential Vd at drain D is set to about (Vera+Vadd).

In the potential relationship of the third embodiment, as with the first and second embodiments, because potential Vs (=Vadd) at source S is larger than potential Vg (=−Vne) at gate G, leakage current (electrons flow inverse direction) Ileak from drain D to source S is reduced, and electrons are not trapped in the gate insulating film or the interface state.

Therefore, compared with the first and second embodiments, the reliability of the N-channel MOS transistor can further be improved in the transfer transistor unit. As with the first and second embodiments, because the potential is not applied to the well of the N-channel MOS transistor, it is not necessary to consider threshold fluctuations of other N-channel transistors.

As shown in FIG. 18, potential Vg at gate G is set to power-supply voltage (Vdd), well potential Vwell is set to 0 V, potential Vs at source S is set to Vadd, and potential Vd at drain D is set to about Vadd.

Vadd is transferred from source to the drain because N-channel MOS transistors Tr11 to Trn1 are in the on state, and therefore the electric field between the charge storage layer and the P-type well region is increased in memory cell MC of NAND block BK1. That is, the voltage of Vera applied between the control gate electrode and channel portion of memory cell MC is not changed by setting channel portion (P-type well region) to (Vera+Vadd). Therefore, the data erasing can be performed without problems.

As described above, positive potential Vadd is applied to potential transfer lines CG1, CG2, . . . , CG(n−1), and CGn, and negative potential −Vne is applied to the gate of the N-channel MOS transistor in the cut-off state, thereby preventing the leakage current generated in the N-channel MOS transistor in the cut-off state.

(4) Effect

Figure 19:
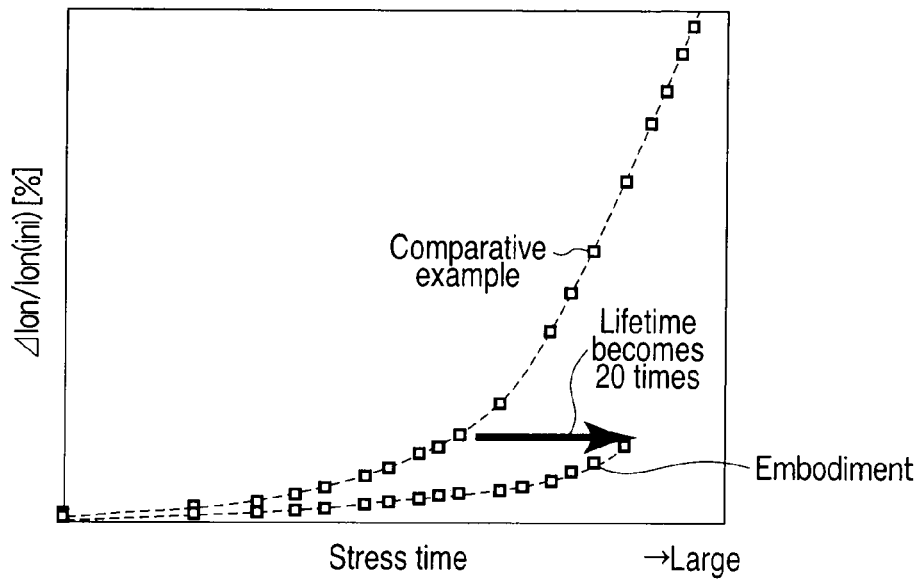
FIG. 19 is a view showing a relationship between a stress time and an on-current.

FIG. 19 shows an index concerning the reliability of the N-channel MOS transistor in the transfer transistor unit.

A stress time of a horizontal axis expresses a time which voltage Vera is applied between the source and drain of the N-channel MOS transistor in the cut-off state, and the stress time is substantially proportional to the number of erasing times.

ΔIon/Ion(ini) of a vertical axis expresses transfer ability of the N-channel MOS transistor, Ion(ini) is an on current in an initial state, and ΔIon is an amount of on-current change with respect to the initial state (Ion(ini)−Ion). Ion is gradually decreased with increasing stress time.

The embodiment corresponds to the potential relationship of FIG. 9, and the comparative example corresponds to the potential relationship of FIG. 11.

In the embodiment, compared with the comparative example, even if the stress time is increased, the on-current change ratio ΔIon/Ion can be suppressed to a small level. The same effect is obtained even in the potential relationships of FIGS. 14 and 17.

For example, assuming that a lifetime of the N-channel MOS transistor expires when the on-current change ratio ΔIon/Ion exceeds 10%, the lifetime of the N-channel MOS transistor of this embodiment becomes about 20 times the lifetime of the N-channel MOS transistor of the comparative example.

Accordingly, in the embodiment of the present invention, the reliability of the N-channel MOS transistor can be improved in transferring the high potential to the word line.

(5) Others

In the potential relationship during the data erasing in the first and third embodiments, preferably positive potential Vadd is set in the range of 0 V<Vadd≤1 V.

It is thought that the reliability of the N-channel transistor in the transfer transistor unit is effectively secured as positive potential Vadd is increased. However, when positive potential Vadd is increased, the value (Vera+Vadd) applied to the channel portion during the data erasing is also increased.

Accordingly, when the Vera has the value of 15 V to 40 V, it is realistically thought that an upper limit of positive potential Vadd is set to 1 V from the relationship of diffusion layer-well breakdown voltage.

In the potential relationship during the data erasing in the second embodiment, preferably negative potential −Vne is set in the range of −1 V≤−Vne<0 V.

It is thought that the reliability of the N-channel transistor in the transfer transistor unit is effectively secured as negative potential −Vne is decreased. However, when negative potential −Vne is decreased, unfortunately the time negative potential −Vne is generated is lengthened.

Accordingly, it is realistically thought that a lower limit of negative potential −Vne is set to −1 V.

Figure 20:
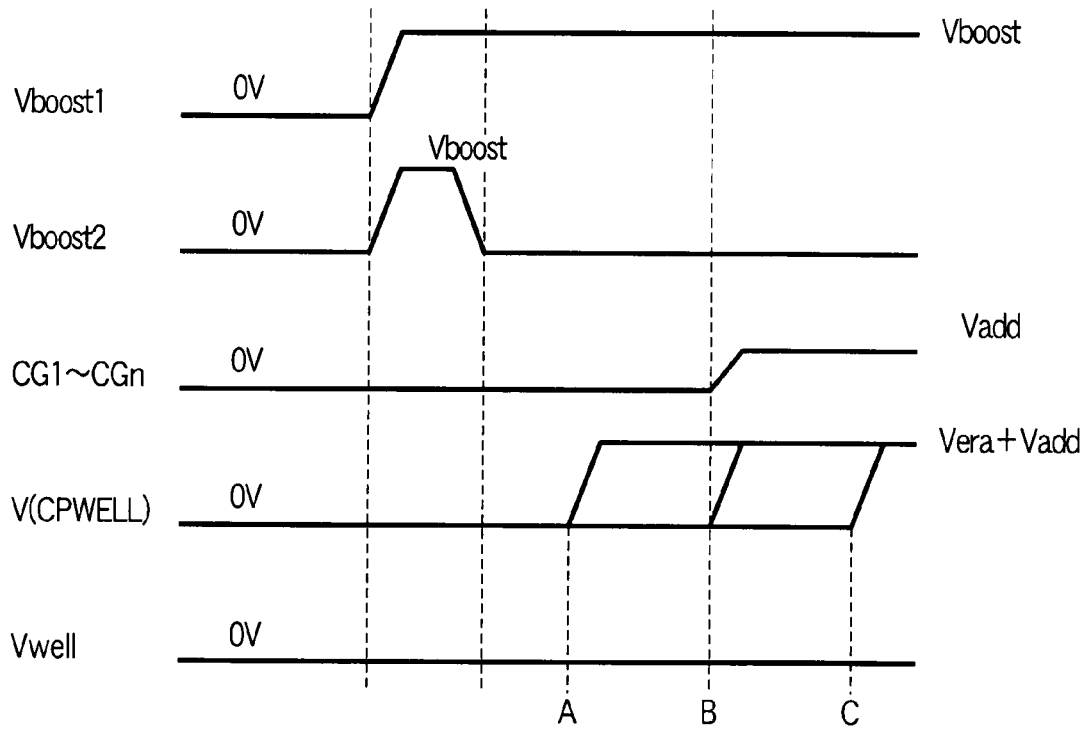
FIG. 20 is a wave form chart showing a wave form in a first example.

FIG. 20 shows a relationship between the time the potential transfer line is changed from 0 V to Vadd and the time (Vera+Vadd) is applied to the channel portion in the potential relationship during the data erasing in the first embodiment.

In FIG. 20, the numeral Vboost1 designates the output potential at the booster in the transfer transistor unit corresponding to the NAND block that becomes the data erasing target, and the numeral Vboost2 designates the output potential at the booster in the transfer transistor unit corresponding to the NAND block that does not become the data erasing target.

The numerals CG1 to CCn designate the potential at the transfer potential line, and the numeral V(CPWELL) designates the potential at the P-type well region in which the memory cell is formed.

After output potential Vboost2 at the booster in the transfer transistor unit corresponding to the NAND block that does not become the data erasing target is changed from Vboost to 0 V, transfer potential lines CG1 and CG2 are changed from 0 V to Vadd, and potential V(CPWELL) at the P-type well region is changed from 0 V to (Vera+Vadd).

The time the potential V(CPWELL) at the P-type well region is changed to (Vera+Vadd) may be set (A point) before the time the potential transfer line is changed to Vadd, may be set (B point) at the same time as the potential transfer line is changed to Vadd, or may be set (C point) after the time the potential transfer line is changed to Vadd.

However, in order to maximally exert the effect of the present invention, preferably the time potential V (CPWELL) at the P-type well region is changed to (Vera+Vadd) is set at the same time as the potential transfer line is changed to Vadd, or set (B point or later) after the potential transfer line is changed to Vadd. This is because the time during which the potential difference between the source and drain of N-channel MOS transistor Tr becomes large can be shortened in consideration of Vadd<Vera.

FIG. 21 shows the time the output potential at the booster corresponding to the NAND block that does not become the data erasing target is set to negative potential −Vne in the potential relationship during the data erasing in the second embodiment.

In FIG. 21, the numeral Vboost1 designates the output potential at the booster in the transfer transistor unit corresponding to the NAND block that becomes the data erasing target, and the numeral Vboost2 designates the output potential at the booster in the transfer transistor unit corresponding to the NAND block that does not become the data erasing target.

The numerals CG1 to CCn designate the potential at the transfer potential line, and the numeral V(CPWELL) designates the potential at the P-type well region in which the memory cell is formed.

After output potential Vboost2 at the booster in the transfer transistor unit corresponding to the NAND block that does not become the data erasing target is changed from Vboost to 0 V, output potential Vboost2 is changed from 0 V to −Vne at the A point. Then, for example, potential V(CPWELL) at the P-type well region is changed from 0 V to Vera at the B point.

For the reason similar to that of FIG. 20, preferably the time potential V (CPWELL) at the P-type well region is changed to (Vera+Vadd) is set at the same time as the potential transfer line is changed to Vadd, or set (B point or later) after the potential transfer line is changed to Vadd.

FIG. 22 shows the time the output potential at the booster corresponding to the NAND block that does not become the data erasing target is set to negative potential −Vne in the potential relationship during the data erasing in the third embodiment.

In FIG. 22, the numeral Vboost1 designates the output potential at the booster in the transfer transistor unit corresponding to the NAND block that becomes the data erasing target, and the numeral Vboost2 designates the output potential at the booster in the transfer transistor unit corresponding to the NAND block that does not become the data erasing target.

The numerals CG1 to CCn designate the potential at the transfer potential line, and the numeral V(CPWELL) designates the potential at the P-type well region in which the memory cell is formed.

After output potential Vboost2 at the booster in the transfer transistor unit corresponding to the NAND block that does not become the data erasing target is changed from Vboost to 0 V, output potential Vboost2 is changed from 0 V to −Vne at the A point. Then, for example, transfer potential lines CG1 and CG2 are changed from 0 V to Vadd, and potential V(CP-WELL) at the P-type well region is changed from 0 V to (Vera+Vadd) at the B point.

However, as with the first embodiment (FIG. 20), the time potential V(CPWELL) at the P-type well region is changed to (Vera+Vadd) may be set before or after the time transfer potential lines CG1 and CG2 are changed to Vadd. For the reason similar to that of the first embodiment, preferably the time potential V (CPWELL) at the P-type well region is changed to (Vera+Vadd) is set at the same time as the potential transfer line is changed to Vadd, or set (B point or later) after the potential transfer line is changed to Vadd.

4. Application Examples

The embodiments of the present invention can be applied to the NAND type flash memory.

There is no particular limitation to the memory cell structure of the NAND type flash memory. For example, the embodiments of the present invention can be applied to a fin memory cell and a three-dimensional memory cell (so called BiCS structure).

The characteristic of the high-breakdown-voltage type N-channel MOS transistor is easily affected by the fixed charge arising from the material. For example, when an insulating film containing carbon (C) is used as an element separation material, the carbon element becomes the positive fixed charge to increase the off-leakage current.

Because the embodiments of the present invention relate to the technique of suppressing the off-leakage current, the embodiments of the present invention are effectively applied in such situations.

Recently, a so-called MONOS memory cell in which the charge storage layer is formed by an insulating film made of nitride silicon and a structure in which a so-called high-k material having a high dielectric constant is disposed between the charge storage layer and the control gate electrode are proposed.

When the embodiments of the present invention are applied to the NAND type flash memory having the new structure and material, the characteristic of the high-breakdown-voltage type N-channel MOS transistor is effectively improved.

In the MONOS memory cell, because trapped electrons are hardly drawn from the charge storage layer during the data erasing, holes are injected from the channel portion into the charge storage layer to neutralize electrons trapped in the charge storage layer, thereby performing the data erasing.

However, there is generated a problem in that the time necessary for the data erasing is lengthened. That is, the MONOS memory cell has the feature that the data erasing time is longer than that of the floating gate type memory cell.

In the embodiments of the present invention, the reliability of the high-breakdown-voltage type N-channel MOS transistor is not degraded even if the data erasing time is lengthened. Therefore, the embodiments of the present invention are effectively applied to the MONOS memory cell.

5. Conclusion

Accordingly, the reliability of the N-channel MOS transistor can be improved in transferring the high potential to the word line.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
a semiconductor substrate;
a first array of first memory cells and a second array of second memory cells where positions of the first memory cells in the first array correspond to positions of respective second memory cells in the second array, each of the first and second memory cells having a charge storage layer and a control gate electrode, said first and second arrays disposed above the semiconductor substrate;
first word lines connected to the control gate electrodes of the first memory cells;
second word lines connected to the control gate electrodes of the second memory cells;
first N-channel MOS transistors connected to the first word lines;
second N-channel MOS transistors connected to the second word lines; and
plural potential transfer lines connected through pairs of the first and second N-channel MOS transistors to corresponding pairs of the first and second word lines, each pair of the first and second word lines connected to control gate electrodes of corresponding first and second memory cells within the first and second arrays, and
a control circuit which is configured to execute data erasing of the first memory cells in the first array, in condition of setting the semiconductor substrate to a first potential with a plus value, setting the potential transfer lines and the first word lines to a second potential with a plus value lower than the first potential and higher than 0V by turning the first N-channel MOS transistors on, and setting the second word lines to a floating state by turning the second N-channel MOS transistors off,
wherein the control circuit is configured to turn the second N-channel MOS transistors off after turning the first and second N-channel MOS transistors on under a condition of setting the potential transfer line to a ground potential, and
the control circuit is configured to set the potential transfer lines to the second potential after turning the second N-channel MOS transistors off.

2. The memory according to claim 1,
wherein the second potential is 1V or less.

3. The memory according to claim 1,
wherein the first and second N-channel MOS transistors formed on one continuous well or on the semiconductor substrate.

4. The memory according to claim 1,
wherein the first array belongs to a first NAND block, and the second array belongs to a second NAND block.

5. The memory according to claim 4, further comprising
a bit line which is connected to both of the first and second NAND blocks;
a sense amplifier senses data from one of the first and second NAND blocks, and
a high breakdown voltage type MOS transistor which is connected between the bit line and the sense amplifier.

6. The memory according to claim 1, wherein the control circuit is configured to apply the first potential to the semiconductor substrate applying a third potential to gates of the second N-channel MOS transistors.

7. The memory according to claim 1,
wherein each of the first and second N-channel MOS transistors is a high breakdown voltage type MOS transistor.

8. The memory according to claim 3, wherein the one continuous well is applied ground voltage in the data erasing of the first memory cell.

9. The memory according to claim 1, wherein the control circuit is configured to apply a third potential with a minus value to gates of the second N-channel MOS transistors in a data erasing of the first memory cells.

* * * * *